(12) United States Patent
Eaton et al.

(10) Patent No.: US 7,868,441 B2
(45) Date of Patent: Jan. 11, 2011

(54) PACKAGE ON-PACKAGE SECURE MODULE HAVING BGA MESH CAP

(75) Inventors: David D. Eaton, San Jose, CA (US);
David R. Staab, Los Gatos, CA (US);
Ruben C. Zeta, Milpitas, CA (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 351 days.

(21) Appl. No.: 11/800,175

(22) Filed: May 3, 2007

(65) Prior Publication Data
US 2008/0251906 A1    Oct. 16, 2008

Related U.S. Application Data

(63) Continuation-in-part of application No. 11/786,871, filed on Apr. 13, 2007.

(51) Int. Cl.
*H01L 21/44*      (2006.01)
*H01L 21/56*      (2006.01)
*H01L 23/488*     (2006.01)

(52) U.S. Cl. ............... 257/686; 257/738; 257/E23.023; 257/E21.476; 257/E21.502; 438/108; 438/613

(58) Field of Classification Search ................ 257/686
See application file for complete search history.

(56) References Cited

U.S. PATENT DOCUMENTS

| 5,783,870 | A | 7/1998 | Mostafazadeh et al. ..... 257/791 |
|---|---|---|---|
| 5,861,662 | A | 1/1999 | Candelore .................... 257/679 |
| 5,956,576 | A | 9/1999 | Toy et al. ..................... 438/125 |
| 6,646,565 | B1 | 11/2003 | Fu et al. ...................... 340/687 |
| 7,054,162 | B2 | 5/2006 | Benson et al. .............. 361/760 |
| 7,065,656 | B2 | 6/2006 | Schwenck et al. ........... 713/194 |
| 7,126,829 | B1 | 10/2006 | Yen ............................. 361/803 |
| 2001/0033012 | A1 | 10/2001 | Kommerling et al. ....... 257/679 |
| 2002/0127771 | A1 | 9/2002 | Akram et al. ............... 438/107 |
| 2003/0008432 | A1 | 1/2003 | Kux et al. ................... 438/106 |

(Continued)

OTHER PUBLICATIONS

Supplementary European Search Report for EP07836686 dated Jun. 15, 2009 (3 pages).

(Continued)

*Primary Examiner*—Jarrett J Stark
*Assistant Examiner*—Lawrence Tynes, Jr.
(74) *Attorney, Agent, or Firm*—North Weber & Baugh LLP

(57) ABSTRACT

A package-on-package (POP) secure module includes a BGA mesh cap, a first BGA package, and a second BGA package. The first BGA package includes a first integrated circuit (for example, a microcontroller that includes tamper detect logic). The second BGA package includes a second integrated circuit (for example, a memory). The second BGA package is piggy-back mounted to the first BGA package and the BGA mesh cap is piggy-back mounted to the second BGA package. A printed circuit board substrate member of the BGA mesh cap includes an embedded anti-tamper mesh. This mesh is connected in a protected manner within the module to the first integrated circuit. When the module is in use, a mesh embedded in an underlying printed circuit board is coupled to the BGA cap mesh so that both anti-tamper meshes are controlled by the tamper detect logic.

21 Claims, 14 Drawing Sheets

U.S. PATENT DOCUMENTS

| | | | |
|---|---|---|---|
| 2003/0052399 A1 | 3/2003 | Shibata | 257/686 |
| 2006/0081497 A1* | 4/2006 | Knudsen | 206/701 |
| 2006/0086534 A1 | 4/2006 | Oggioni et al. | 174/261 |
| 2006/0087883 A1 | 4/2006 | Ozguz et al. | 365/185.04 |
| 2006/0170091 A1 | 8/2006 | Karnezos | 257/686 |
| 2006/0220210 A1* | 10/2006 | Karnezos et al. | 257/686 |
| 2006/0231633 A1 | 10/2006 | Farooq et al. | 235/492 |
| 2006/0231938 A1 | 10/2006 | Mangrum | 257/686 |
| 2007/0018334 A1 | 1/2007 | Peytavy et al. | 257/778 |
| 2007/0038865 A1* | 2/2007 | Oggioni et al. | 713/178 |

OTHER PUBLICATIONS

International Search Report and Written Opinion of International Searching Authority for PCT/US07/17755 dated Mar. 11, 2008 (12 pages).

Web pages from www.amkor.com, 18 pages (downloaded and printed out Apr. 30, 2007).

* cited by examiner

PACKAGE-ON-PACKAGE (POP)
SECURE MODULE

ANTI-TAMPER MESH IN UPPER BGA SUBSTRATE
PREVENTS INTRUSION FROM ABOVE

BOTTOM VIEW WITH ENCAPSULATION REMOVED

ANTI-TAMPER PICKET FENCE PREVENTS
INTRUSION FROM THE SIDES

POINT OF SALE TERMINAL

ANTI-TAMPER MESH IN PCB PREVENTS
INTRUSION FROM BELOW

SILICON MESH AND COVER

PACKAGE ON-PACKAGE SECURE MODULE HAVING BGA MESH CAP

CROSS REFERENCE TO RELATED APPLICATION

This application is a continuation-in-part of, and claims priority under 35 U.S.C. §120 from, nonprovisional U.S. patent application Ser. No. 11/786,871, entitled "Package-On-Package Secure Module Having Anti-Tamper Mesh In The Substrate Of The Upper Package," by Steven M. Pope and Ruben C. Zeta, filed on Apr. 13, 2007, the subject matter of which is incorporated herein by reference.

TECHNICAL FIELD

The described embodiments relate to securing electronic components and data from unauthorized access, and more particularly to securing electronic components in Point Of Sale (POS) terminals.

BACKGROUND INFORMATION

Purchases are often made using an electronic device called a Point Of Sale (POS) terminal. The POS terminal is typically coupled to a financial institution via an electronic communication link. A customer in a store may, for example, present a debit card, credit card, cash card or smart card to the store's cashier for payment. Consider an example of a transaction with a smart card. The customer presents the smart card to the cashier of the store. The cashier pushes the smart card into a smart card reader port on the POS terminal and the POS terminal reads an account number stored in the smart card. The customer then, for identification purposes, typically enters a Personal Identification Number (PIN) into a keypad device coupled to the POS terminal. The customer may also enter other identification information. The customer may, for example, provide a signature on a signature capture device coupled to the POS terminal.

The POS terminal then uses an encryption key stored in the POS terminal to encrypt the account number (from the smart card), the identification number (for example, the PIN number), and other information about the transaction such as the amount of the transaction and the date of the transaction. The encrypted information is sent from the POS terminal to the financial institution via a modem or other electronic communication link.

The financial institution receives the encrypted information and uses an encryption key to decrypt the information and recover the account number, identification information, and information about the transaction. In the case where the transaction is a debit transaction, the bank account of the customer is debited. A confirmation of the transaction is then encrypted using the encryption key and the encrypted confirmation is communicated from the financial institution back to the POS terminal. The POS terminal uses the encryption key stored in the point of sale terminal to decrypt the confirmation. Typically, the confirmation is printed out as part of a transaction receipt and a copy of the receipt is provided to the customer.

Accordingly, it is seen that sensitive financial and identification information is entered into and passes through the POS terminal. Encryption keys are typically stored in the POS terminal so that the POS terminal can communicate with the financial institution in a secure manner. Moreover, as the POS terminal is used, information about customers is stored in and/or passes through the POS terminal. Such information may include account numbers and their associated PIN numbers.

Various methods are employed to prevent such sensitive information from falling into the hands of thieves. In one example, the integrated circuits within the POS terminal that contain the sensitive information are surrounded, encased or covered with a fine wire mesh. Certain of the conductors of the mesh are coupled to a first terminal of the integrated circuit, whereas others of the conductors of the mesh are coupled to a second terminal of the integrated circuit. The integrated circuit monitors the first and second terminals. If a thief were to attempt to probe through the mesh to get access to the integrated circuit, then certain of the conductors would likely be cut or pushed together. This condition would be detected by the integrated circuit as a tamper condition. If the integrated circuit were to detect such a tamper condition, then the integrated circuit would quickly erase the sensitive information (for example, encryption keys) so that if the thief were to then gain access to the integrated circuit, the sensitive information would have already been erased.

In one exemplary prior art POS terminal, the POS terminal includes a processor integrated circuit, a Static Random Access Memory (SRAM) integrated circuit, and a non-volatile memory integrated circuit. The processor and SRAM integrated circuits are covered with an anti-tamper mesh. An application program is stored in the nonvolatile memory. Upon power up, an operating system executing on the processor transfers the application program from the nonvolatile memory to the SRAM. Encryption keys are stored in Read Only Memory (ROM) on the processor integrated circuit. If the processor validates the application program to be a valid image, then the processor executes the application program out of SRAM. Subsequent operation of the POS terminal may use the encryption keys and may temporarily place the encryption keys in the SRAM. Accordingly, upon detection of a tamper condition, the SRAM as well as other volatile storage locations in the processor are quickly erased before a thief can gain access to the sensitive information stored in volatile memory in the processor and SRAM integrated circuits.

Numerous techniques exist in the prior art for providing a security mesh. For example, U.S. Pat. No. 6,646,565 describes a POS terminal having a secure case. The case includes what is called a security fence module that is sandwiched between two printed circuit boards. Each of the printed circuit boards includes a serpentine trace layer so that the assembly of the two printed circuit boards and the security fence module together enclose a secured volume.

U.S. Pat. No. 7,054,162 describes a security module that includes a substrate and a cover. The substrate and cover include inter-digitated serpentine serial conductive paths. When the cover and substrate are abutted together through ball grid array interconnects, the serpentine conductive paths essentially surround the volume enclosed between the cover and substrate. The grid array of connections at the periphery of abutting cover and substrate have a staggered row or picket fence configuration that prevents intrusion from the side.

U.S. Patent Application Publication No. 2007/0038865 describes a cap that is adapted to mount to a printed circuit board such that tamper-proof tracks in the cover are linked with tamper-proof tracks in the printed circuit board. The tracks in the cap and printed circuit board together form a tamper-proof security shield that protects a chamber.

U.S. Pat. No. 7,065,656 describes a method of protecting a printed circuit board from tampering by applying flexible plastic polymer layers having embedded trip wires.

U.S. Patent Application Publication No. 2006/0231633 describes a tamper resistant ceramic multi-chip module (MCM) that includes a ceramic chip carrier and a ceramic cap. Each of the chip carrier and the cap includes what are called security meander lines. Solder balls or solder fillets couple the cap to the chip carrier so as to enclose an internal cavity.

U.S. Patent Application Publication No. 2006/0087883 describes an anti-tamper module involving a connection layer that connects the module to an external system using a ball-grid array of solder balls. In one example, a wire mesh encased in epoxy is a protective layer that encases the module.

U.S. Pat. No. 5,861,662 describes an anti-tamper shield for an integrated circuit. In one example, the conductors of the shield have a grid pattern and are made of conductive epoxy.

U.S. Patent Application Publication No. 2007/0018334 describes a cavity-down integrated circuit package that has an embedded security shield. A printed circuit board also has an embedded security shield. When the package is connected to the printed circuit board with ball connectors, the shield in the package and the shield in the printed circuit board together form a security envelope that shields the integrated circuit of the package from tampering.

Unfortunately, providing a security mesh for a point or sale terminal circuit is typically undesirably expensive and/or is inadequate. An alternative solution is sought.

SUMMARY

A Package-On-Package (POP) secure module sees use in a Point Of Sale (POS) terminal. The POP secure module includes a first ball grid array (BGA) package portion and a second BGA package portion. The first BGA package portion includes a substrate member, an array of bond balls that is disposed on a side of a substrate member, and an array of lands that is disposed on the opposite side of the substrate member. Bond balls of the second BGA package portion are fixed to the lands of the first BGA package portion such that the second BGA package portion is piggy-back mounted to the first BGA package portion. Embedded in the substrate member of the second BGA package portion is a first anti-tamper security mesh. The first anti-tamper security mesh extends laterally in the plane of the substrate member, and also extends vertically in a curtain-like fashion to form a picket fence security mesh structure around the side edges of the module.

An integrated circuit in the first BGA package portion is coupled to, drives and monitors the first anti-tamper security mesh. When the module is disposed on a Printed Circuit Board (PCB) within a POS terminal, the integrated circuit is coupled to, drives and monitors a second anti-tamper security mesh. The second anti-tamper security mesh is realized in a metal trace layer within the PCB upon which the POP secure module is mounted. The second anti-tamper security mesh extends underneath the POP secure module. Accordingly, the planar portion of the first mesh in the substrate member of the second BGA package portion protects against intrusion from above, the picket fence peripheral extension of the first mesh protects against intrusion from the sides, and the second mesh in the underlying PCB protects against intrusion from below.

In one example, the integrated circuit in the first BGA package portion is a specialized integrated circuit that includes tamper detection logic and special circuitry that is specially adapted for use in a point of sale terminal. The integrated circuit is produced and sold by an entity (for example, a first semiconductor company) that does not make and sell memory devices for general use. The second BGA package portion contains a general purpose memory integrated circuit that is produced and sold by an entity (for example, a second semiconductor company) that does sell discrete memory devices for general use. This memory integrated circuit is a type that sees primary use in applications other than in point of sale terminals. Compared to the specialized integrated circuit, the memory integrated circuit is mass produced in larger volumes. The memory needed in the secure module is provided by including the discrete memory integrated circuit rather than by providing additional memory on the specialized integrated circuit and making the specialized integrated circuit larger in order to take advantage of the relatively low cost of providing the memory in the form of an integrated circuit that is produced in higher volumes. Both the specialized integrated circuit and the mass produced memory integrated circuit are enclosed in a secure volume that is shielded by the first and second anti-tamper security meshes. If a tamper condition is detected, then the contents of the discrete memory integrated circuit are quickly erased as prompted by tamper detection logic in the specialized integrated circuit.

The secure module involving a separate SRAM integrated circuit in a POP module allows different versions of the module to be realized without having to modify either the design of the specialized integrated circuit or the substrate member of the first BGA package portion. An added benefit of the POP package is that a different sized memory or different memory type can be provided in different version of the module without changing the first BGA package portion or its specialized integrated circuit.

In a second novel aspect, the specialized integrated circuit and the memory integrated circuit are disposed, side by side, in a single cavity-down ball grid array (BGA) package. The BGA package includes a substrate member. An anti-tamper security mesh is embedded in the substrate member, and the specialized integrated circuit is coupled to, drives and monitors the anti-tamper security mesh. When the BGA package is disposed on a PCB within a point of sale (POS) terminal, the specialized integrated circuit also is coupled to, drives and monitors a second anti-tamper security mesh. The second anti-tamper security mesh is realized in a metal trace layer within the PCB upon which the BGA package is mounted. The second anti-tamper security mesh extends underneath the BGA package.

In a third novel aspect, a package-on-package secure module includes a first BGA package portion, a second BGA package portion, and a BGA mesh cap. The first BGA package portion includes an array of first bond balls disposed on the bottom side of a first substrate member of the first BGA package portion, and also includes an array of first lands disposed on an upper side of the first substrate member. A first integrated circuit die (for example, a microcontroller that includes tamper detect logic) is fixed to the upper side of the first substrate member. The first lands surround the location at which the first integrated circuit die is attached in the center of the upper side of the first substrate member.

The second BGA package portion has a plurality of second bond balls disposed on the bottom side of a second substrate member. The second bond balls are disposed around the periphery of the second substrate member on the bottom side of the second substrate member in concentric rings. The second bond balls and the second substrate member form a central cavity underneath the second substrate member. The second bond balls register with and are fixed to the first lands of the first BGA package portion so that the second BGA package portion is piggy-back mounted to the first BGA package portion. The second BGA package portion also includes a plurality of second lands disposed on an upper side of the second substrate member. A second integrated circuit die (for example, a static random access memory) is fixed to the upper side of the second substrate member. The second lands surround the location at which the second integrated circuit die is attached to the upper side of the second substrate member.

The BGA mesh cap includes a third substrate member and a plurality of third bond balls. The third bond balls are disposed around the periphery of the third substrate member on the bottom side of the third substrate member to form a central cavity underneath the third substrate member. The mesh cap is placed down over the second integrated circuit die such that the third bond balls of the mesh cap register with and are fixed to corresponding second lands of the second BGA package portion. An anti-tamper mesh of conductors is embedded within the third substrate member such that conductors of the anti-tamper mesh are not exposed on the upper side of the third substrate member and are not exposed on any side face of the third substrate member.

Tamper detect logic in the first integrated circuit die is connected in a secure manner within the secure module by non-peripheral ones of the second and third bond balls to conductors in the anti-tamper mesh in the BGA mesh cap. Conductors of the anti-tamper mesh are terminated by termination resistors that are contained in the secure module. In some embodiments, an unpopulated surface mount attachment location is provided on the bottom of the secure module so that a POS terminal manufacturer can add another mesh termination resistor to the secure module prior to soldering the secure module onto a printed circuit board of a POS terminal. The added mesh termination resistor is connected to the anti-tamper mesh rather than the mesh termination resistor within the secure module by appropriate connection of various ones of the first bond balls. The anti-tamper mesh is made to extend underneath the secure module when the secure module is in place on the printed circuit board within the POS terminal. The anti-tamper mesh that extends under the secure module is connected so that it and the anti-tamper mesh in the BGA mesh cap together form a single anti-tamper mesh structure that is controlled and monitored by the same tamper detect logic of the first integrated circuit die.

The secure module may be provided to POS terminal manufacturers in assembled form or alternatively the first BGA package portion, the second BGA package portion, and the mesh cap can be provided to a POS terminal manufacturer as separate pieces that can be readily assembled. An identical mesh cap can also be provided for use elsewhere (for example, elsewhere in the POS terminal to extend the anti-tamper mesh laterally over another integrated circuit surface mounted elsewhere on the printed circuit board of the POS terminal).

Further details and embodiments and techniques are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

DETAILED DESCRIPTION

Figure 1:
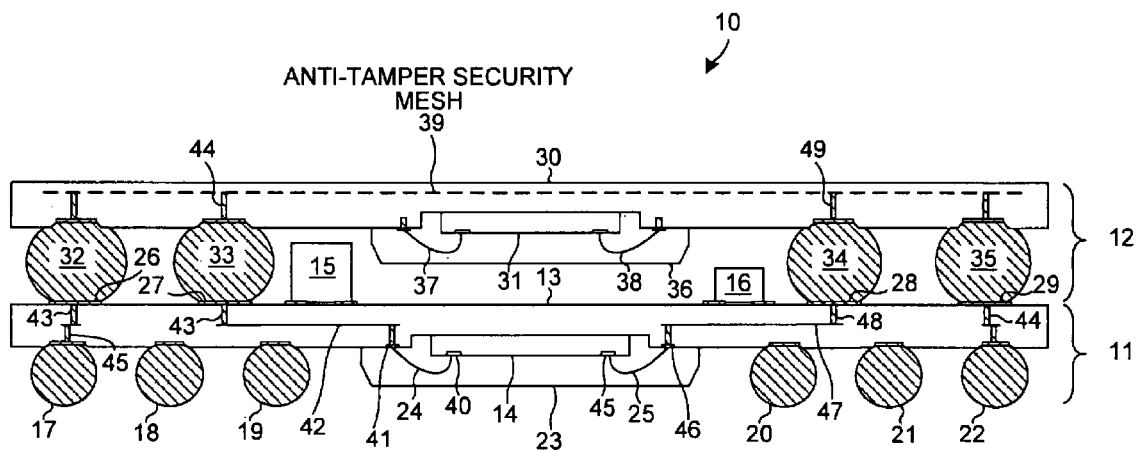
FIG. 1 is a simplified cross-sectional view of a Package-On-Package (POP) secure module 10 in accordance with a first novel aspect.

FIG. 1 is a simplified cross-sectional diagram of a novel Package-On-Package (POP) secure module 10. POP secure module 10 includes a first Ball Grid Array (BGA) package portion 11, and a second BGA package portion 12. First BGA package portion 11 includes a substrate member 13, an integrated circuit die 14, an array of bond balls, an array of lands, and discrete components 15 and 16. Six of the bond balls 17-22 are illustrated in the cross-sectional view. Integrated circuit die 14 is connected by wire bonds to substrate member 13 and is encapsulated with a block of encapsulant 23 such as epoxy potting encapsulant. Two of the bond wires 24 and 25, and four of the lands 26-29 are illustrated in the cross-sectional view.

Second BGA package portion 12 includes a substrate member 30, an integrated circuit die 31, and an array of bond balls. Four of the bond balls 32-35 are illustrated in the cross-sectional view. Integrated circuit die 31 is connected by wire bonds to substrate member 30 and is encapsulated with block of encapsulant 36. Two of the bond wires 37 and 38 are illustrated in the cross-sectional view. The bond balls 32-35 of second BGA package portion 12 register with and are fixed to corresponding ones of the lands 26-29 on the upper surface of the substrate member 13 of the first BGA package portion 11. The second BGA package portion 12 is therefore piggy-back mounted to the first BGA package portion 11 so that the two BGA package portions together form a secure module.

In the illustrated example, the substrate members 13 and 30 are multiple layer printed circuit boards of the type customarily used in the manufacture of BGA packages. Substrate member 30 of the second BGA package portion 12 includes a first anti-tamper security mesh 39 of conductors. The conductors of mesh 39 are approximately 0.2 millimeters wide and are spaced at approximately 0.2 millimeters from one another. As is described in further detail below, the mesh is powered and monitored by tamper control logic (see reference numeral 116 in FIG. 7) on integrated circuit die 14. The tamper control logic on integrated circuit die 14 is connected to conductors in mesh 39 via bond balls of the second BGA package portion that are not located on the periphery of substrate member 30. In the illustration of FIG. 1, the tamper control logic is coupled to a first conductor (WIRE0) of mesh 39 via a first terminal 40, bond wire 24, bond pad 41, laterally extending conductor 42, conductive via 43, land 27, bond ball 33, and conductive via 44. The tamper control logic is also coupled to a second conductor (WIRE1) of mesh 39 via a second terminal 45, bond wire 25, bond pad 46, laterally extending conductor 47, via 48, land 28, bond ball 34, and conductive via 49.

In addition, when POP secure module 10 is disposed on a printed circuit board within a point of sale (POS) terminal, the tamper control logic on integrated circuit die 14 also is coupled to, powers and monitors a second anti-tamper security mesh 50 (see FIGS. 5 and 6) located in the printed circuit board upon which the module 10 is mounted. The tamper control logic on integrated circuit die 14 is connected to the two conductors (WIRE3 and WIRE4) of second mesh 50 via bond balls of the first BGA package portion 11. These bond balls are not located at the periphery of substrate member 13 but rather are located toward the inside of first BGA package portion 11. The connections from integrated circuit die 14 to this second mesh are not seen in the simplified cross-section of FIG. 1, but the tamper control logic is coupled to a first conductor (WIRE3) of the second mesh 50 via a third terminal, a bond wire, an inner bond ball such as bond ball 19, and a surface mount pad on the printed circuit board and a conductive via that extends down into the printed circuit board to the first conductor in second mesh 50. Similarly, the tamper control logic is coupled to a second conductor (WIRE3) of the second mesh via a fourth terminal, a bond wire, an inner bond ball such as bond ball 20, and a surface mount pad on the printed circuit board and a conductive via that extends down into the printed circuit board to the second conductor in second mesh 50.

Figure 2:
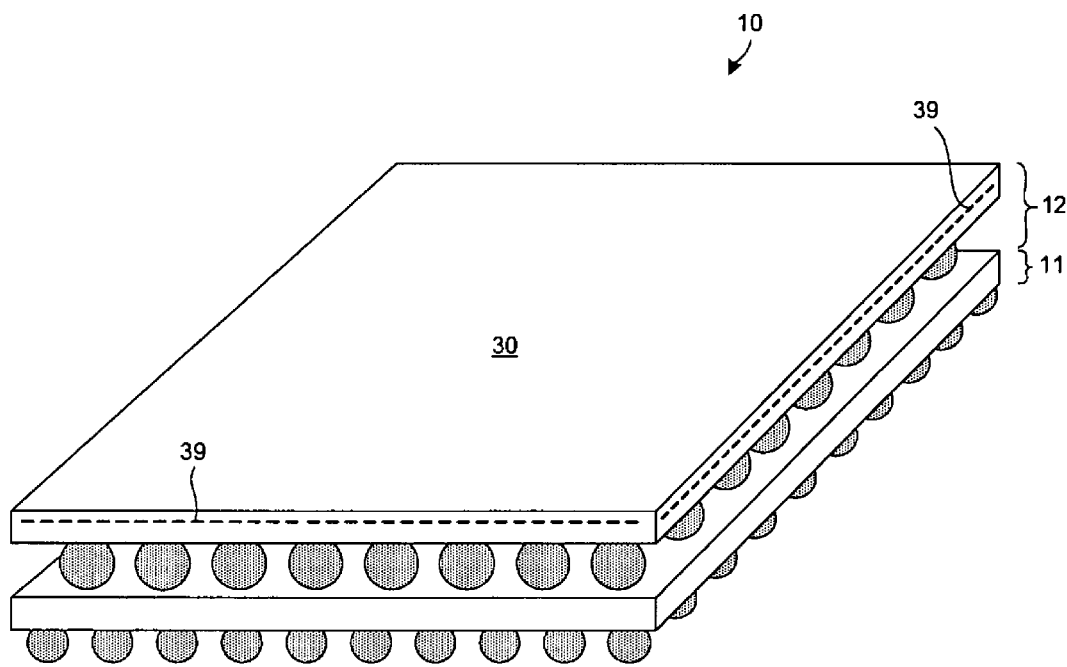
FIG. 2 is a perspective view of the POP secure module 10 of FIG. 1.

FIG. 2 is a perspective view of the POP security module 10 of FIG. 1. The dashed lines labeled with numeral 39 are not visible from the outside of module 10, but rather illustrate the plane in which the mesh 39 is disposed within substrate member 30.

Figure 3:
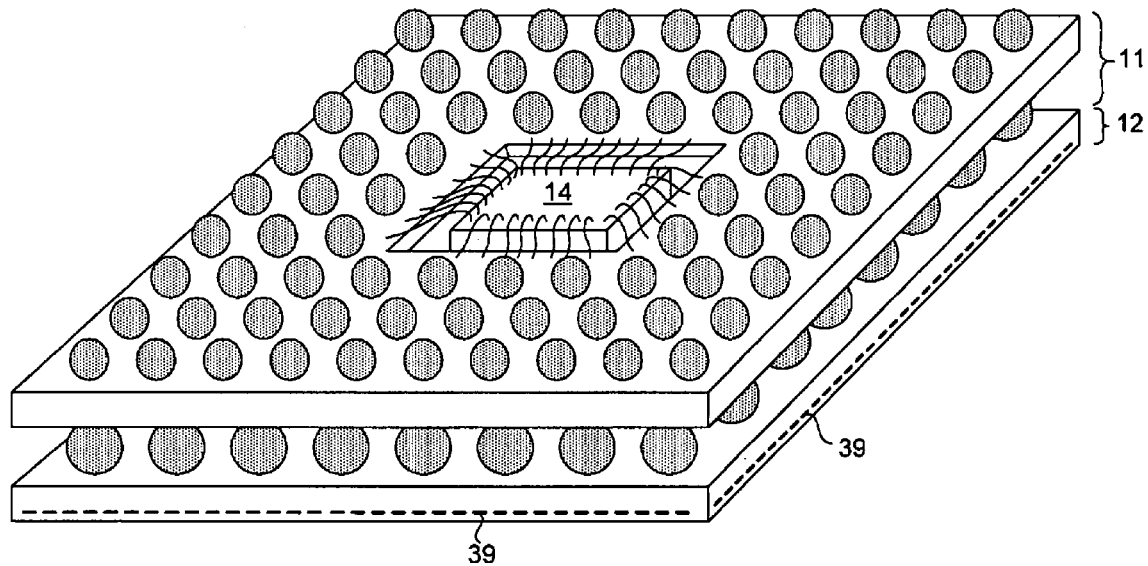
FIG. 3 is a perspective view of the bottom of the POP secure module 10 of FIG. 1 with the encapsulant removed to expose integrated circuit 14.

FIG. 3 is a perspective view of the bottom of module 10 with encapsulant 23 removed to show integrated circuit die 14 and its bond wires.

Figure 4:
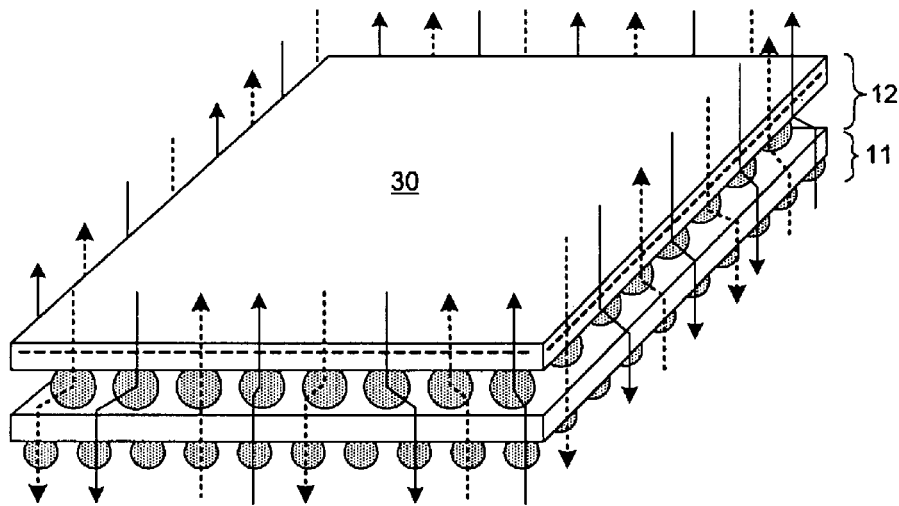
FIG. 4 is a perspective view that illustrates the picket fence extension of the first anti-tamper security mesh.

FIG. 4 illustrates the form of the peripheral portion of mesh 39. Mesh 39, rather than just existing in a laterally extending plane within substrate member 30, is also made to cup down around the side edges of POP secure module 10. In one example, the two conductors of mesh 39 are made to meander vertically up and down through the bond balls of the first and second BGA package portions 11 and 12 so as to form a picket fence like security structure that surrounds the integrated circuit dice 14 and 31 in the lateral dimension. A "picket" here involves a connection from a bond ball of the second BGA package portion 12, through a land on the upper surface of first BGA package portion 11, then down through substrate member 13, and through a bond ball of first BGA package portion 11 such that the two bond balls and the connection between them form a substantially vertical conductive path. In FIG. 4, the arrows drawn with the solid line represent pickets that are parts of the first conductor of mesh 39. The arrows drawn with the dashed line represent pickets that are parts of the second conductor of mesh 39. The picket fence like security structure helps protect against probing of the module from the sides.

In the present example, integrated circuit die 14 is a microcontroller-based integrated circuit that includes tamper control circuitry 116, a specialized boot loader mechanism, a secure memory 123, a processor 122, and other specialized circuitry for a point of sale terminal application. For additional details on integrated circuit 14 see: U.S. patent application Ser. No. 10/918,272, entitled "Secure Transaction Microcontroller With Secure Boot Loader", filed Aug. 13, 2004, by Hsiang et al. (the subject matter of which is incorporated herein by reference). The backside of integrated circuit die 14 is thinned by mechanical grinding so that die 14 is approximately six to eight mils thick. The bond balls of the first BGA package portion 11 are approximately eighteen mils in diameter. The bond balls of the second BGA package portion 12 are approximately twenty one mils in diameter.

In one example, integrated circuit 31 is a mass produced SDRAM die that is manufactured by an entity other than the entity that sells integrated circuit die 14. The maker of the SDRAM makes and sells discrete memory integrated circuits, whereas the maker of integrated circuit die 14 does not. The SDRAM component sees many uses other than use in a POS terminal and consequently it is produced in much higher volumes than is the relatively specialized integrated circuit die 14. SDRAM 31 is provided in secure module 10 rather than providing additional memory on integrated circuit die 14 and making die 14 larger in order to take advantage of the relatively low cost of providing the memory in the form of a mass produced integrated circuit.

Figure 5:
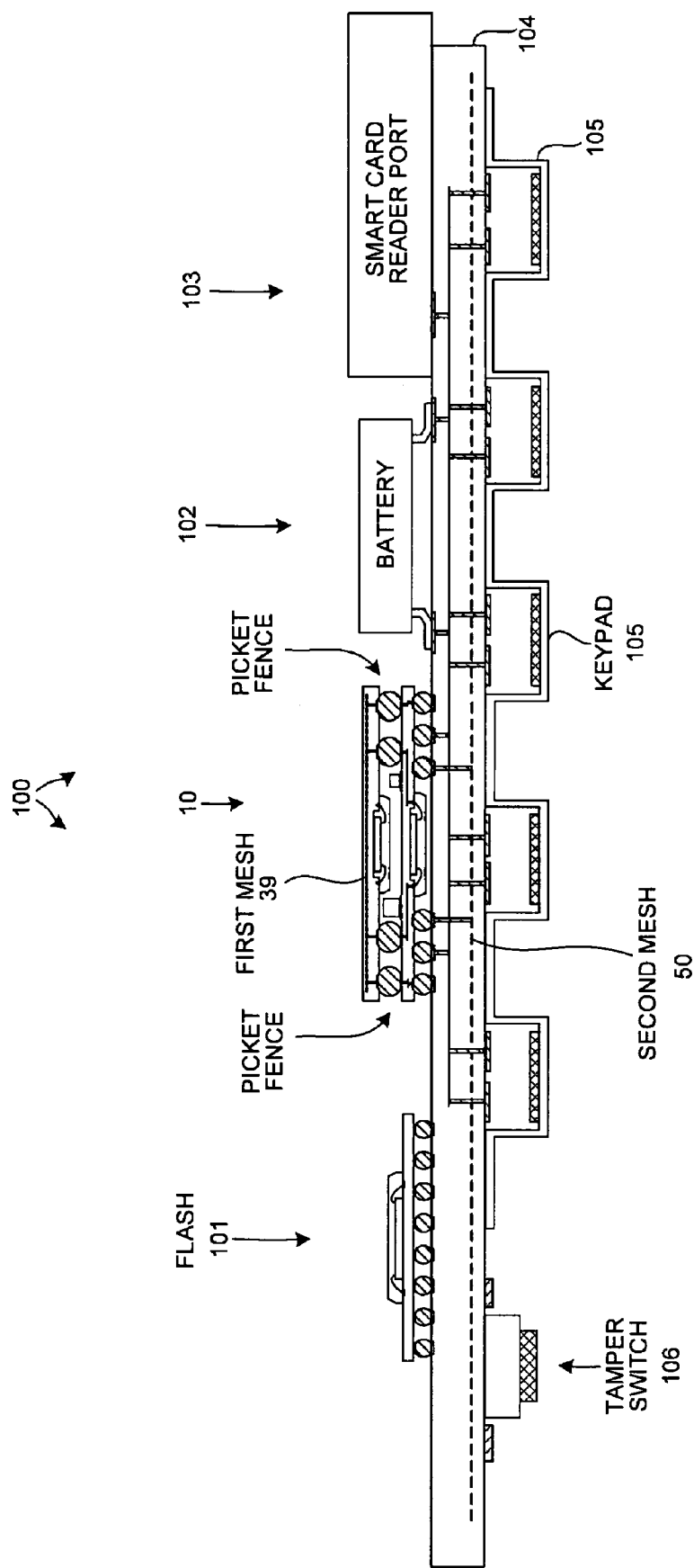
FIG. 5 is a simplified cross-sectional diagram showing the POP secure module 10 of FIG. 1 in use in a point of sale (POS) terminal.

FIG. 5 is a cross-sectional diagram of a portion of a point of sale (POS) terminal 100 that includes POP secure module 10. The plastic enclosure of POS terminal 100 is not illustrated. POP secure module 10, a FLASH memory device 101, a battery 102, and a smart card reader port 103 are surface mounted to a first side of a printed circuit board 104. A flexible keypad 105 and a tamper detect switch 106 are disposed a second side of the printed circuit board 104 opposite module 10. Each of the keys of keypad 105 has a conductive portion. When the key is pressed, the conductive portion of the key makes contact with and couples together an associated pair of interdigitated contact pads on printed circuit board 104. Integrated circuit die 14 includes key scanning circuitry for detecting which key is pressed.

As illustrated in FIG. 5, the second anti-tamper security mesh 50 is disposed in a metal trace layer within printed circuit board 104. In the specific example of FIG. 5, printed circuit board 104 has four metal trace layers. The interdigitated contact pads for the keypad are parts of the bottom metal layer. Second anti-tamper security mesh 50 is located in the next bottom most metal layer so that it is close to keypad 105. Providing mesh 50 close to keypad 105 helps prevent a hacker from gaining access to the backside of the keypad and monitoring key presses.

Figure 6:
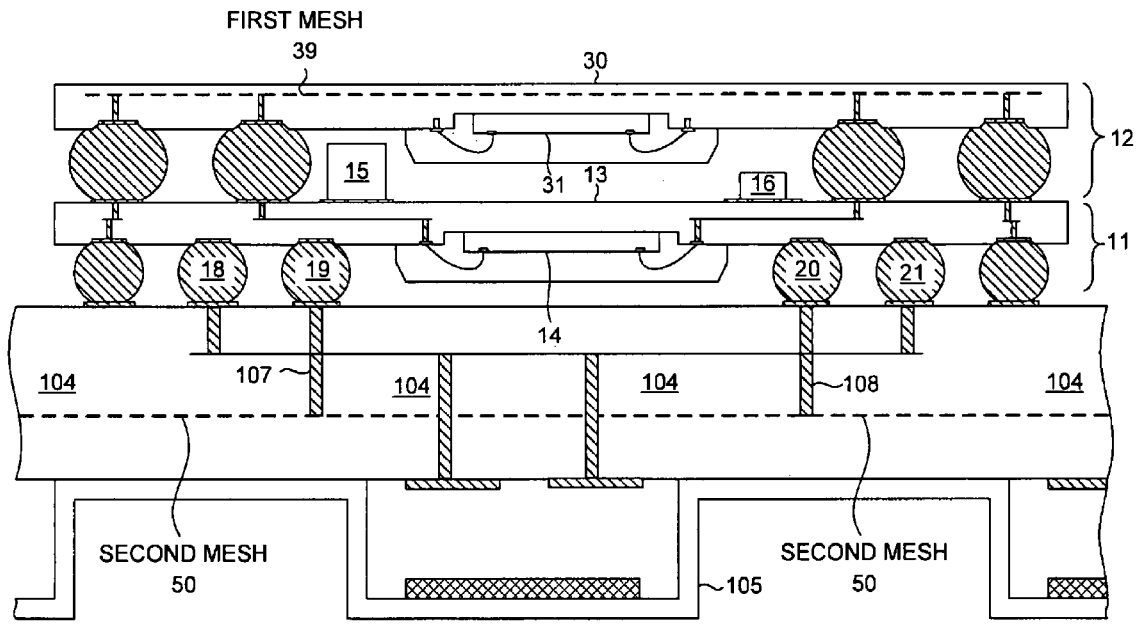
FIG. 6 is an expanded view of a part of FIG. 5.

FIG. 6 shows POS security module 10 and second mesh 50 of FIG. 5 in further detail. Mesh 50 is driven and is sensed by integrated circuit die 14. A third terminal 124 (not shown in FIG. 6, see FIG. 7) of integrated circuit die 14 is coupled by a bond wire (not shown) and conductors (not shown) in substrate member 13 to bond ball 19. Bond ball 19 is in turn connected by a surface mount pad and a vertically extending conductive via 107 to the first conductor in second anti-tamper mesh 50. A fourth terminal 125 (not shown in FIG. 6, see FIG. 7) of integrated circuit die 14 is coupled by a bond wire (not shown) and conductors (not shown) in substrate member 13 to bond ball 20. Bond ball 20 is in turn connected by a surface mount pad and a vertically extending conductive via 108 to the second conductor in second anti-tamper mesh 50.

Figure 7:
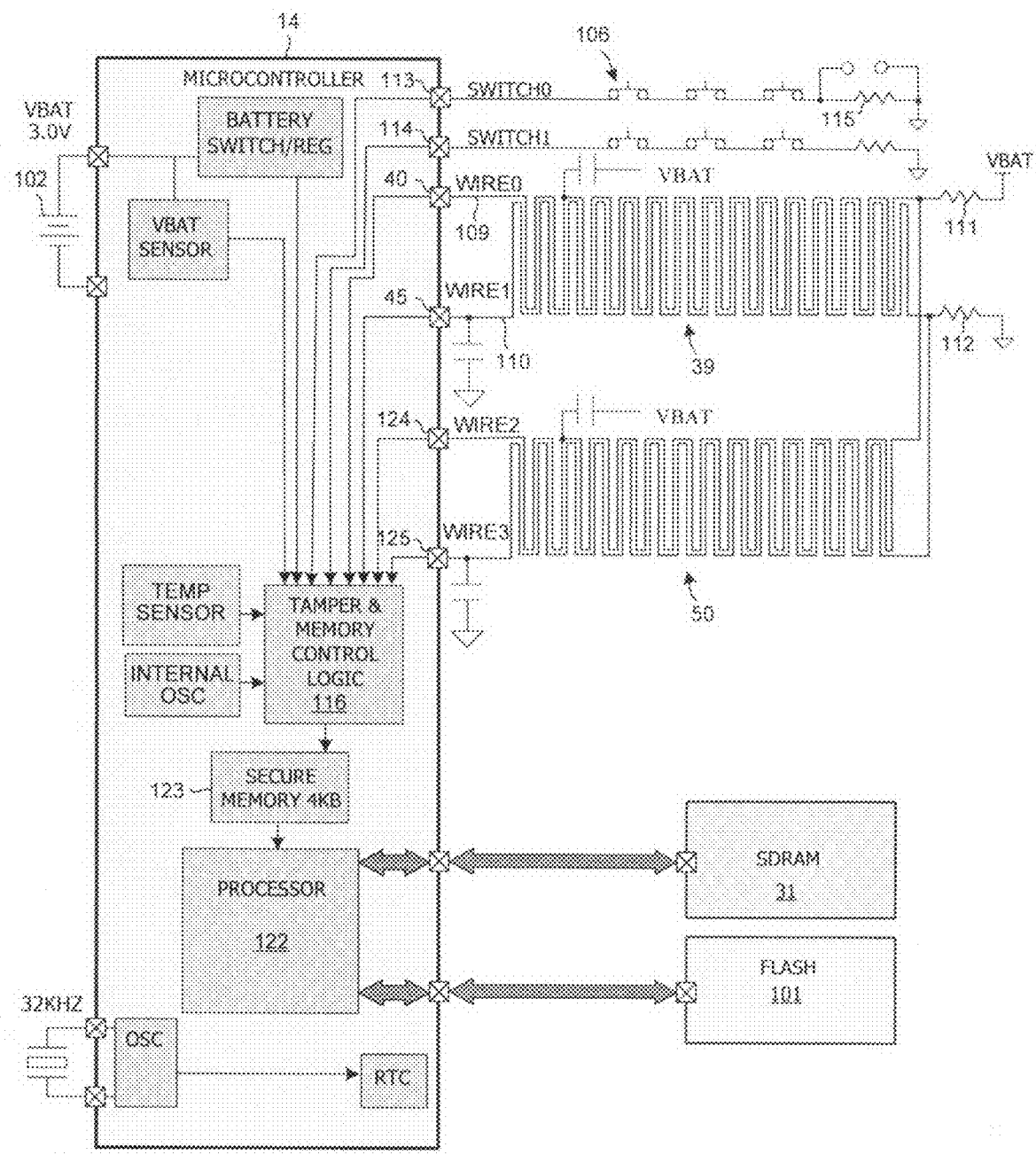
FIG. 7 is a circuit diagram that shows how integrated circuit 14 is connected to the first and second anti-tamper security meshes 39 and 50.

FIG. 7 is a simplified circuit diagram that shows how integrated circuit die 14 is coupled to the first and second meshes 39 and 50. First terminal 40 and second terminal 45 are the terminals illustrated in FIG. 1 that are coupled to the first and second conductors 109 and 110 of the first anti-tamper security mesh 39, respectively. Although mesh 39 is illustrated in FIG. 7 as having a regular serpentine path, the actual paths of conductors 109 and 110 of mesh 39 extend across the plane illustrated with the dashed line in FIG. 1 as well through the picket fence structure illustrated in FIG. 4. Each conductor of mesh 39 is terminated with a termination resistor. First conductor 109 (WIRE0) is terminated by resistor 111 whereas second conductor 110 (WIRE1) is terminated by resistor 112. Termination resistors 111 and 112 are discrete components and are mounted to surface mount pads on the upper surface of substrate member 13. Discrete component 16 of FIG. 1 is resistor 111. Resistor 112 is not seen in the particular cross-section of FIG. 1. Discrete component 15 is a bypass capacitor. There are two bond balls used to connect to each of the two conductors of mesh 39, one for connecting a first end of the conductor to the tamper terminal of the integrated circuit, and a second for connecting the second end of the conductor to its corresponding discrete termination resistor.

The terminals 113 and 114 labeled SWITCH0 and SWITCH1 in FIG. 7 are terminals that detect an opening of a tamper switch. Switch 106 of FIG. 5 is an example of a tamper switch. Tamper switches are positioned at various places in the POS terminal such that opening the POS terminal enclosure will cause one of more of these switches to open. For example, the top and bottom portions of the plastic enclosure of the POS terminal together may hold one of these switches in the closed position. If the enclosure is opened, then the top and bottom portions will separate and will no longer hold switch 106 in the closed position. When switch 106 opens, the voltage on terminal 113 will no longer be pulled to ground potential by resistor 115, but rather the voltage on terminal 113 will be pulled high by a resistor internal to integrated circuit die 14. This high voltage is detected by tamper control logic 116 as a tamper condition.

Figure 8:
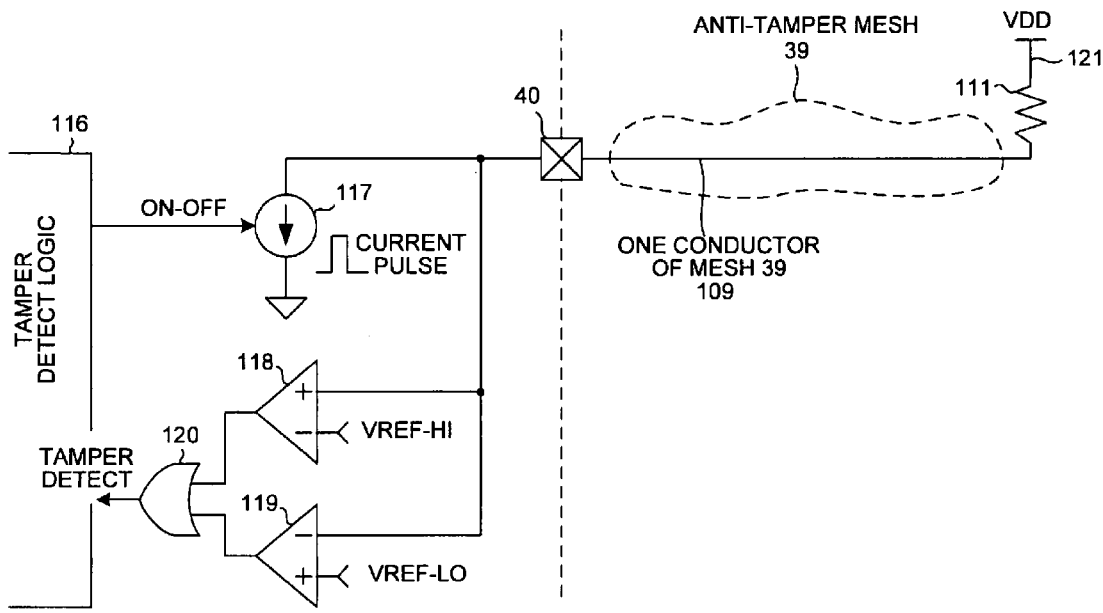
FIG. 8 is a simplified circuit diagram that illustrates how integrated circuit 14 drives and monitors a conductor of a security mesh.

FIG. 8 is a simplified circuit diagram of circuitry that illustrates how the conductor of the first and second meshes are driven and monitored. Initially, current source 117 is disabled by tamper detect logic 116. Termination resistor 111 therefore maintains the voltage on terminal 40 at supply potential VDD. The comparators 118 and 119 and OR gate 120 together output a TAMPER_DETECT signal if the voltage on terminal 40 is either above a high reference voltage VREF-HI or is below a low reference voltage VREF-LO. Only if the voltage on terminal 40 is between the two reference voltages is the TAMPER_DETECT signal not asserted. Accordingly, when the current source 117 is disabled, the voltage on terminal 40 is above VREF-HI and the TAMPER_DETECT signal is asserted. The tamper detect logic 116 within integrated circuit die 14 checks to confirm that TAMPER_DETECT is asserted.

Next, the tamper detect logic 116 causes current source 117 to sink a ten microampere pulse of current. If conductor 109 is intact and if conductor 109 is not touching conductor 110, then the current flow through resistor 111 will be such that the voltage on terminal 40 will be below the high reference voltage VREF-HI and also will be above the low reference voltage VREF-LO. The resistance from terminal 40 to supply voltage VDD node 121 is nominally 50 k ohms (will be greater than 20 k ohms and less than 80 k ohms). Accordingly, if there is no tamper condition, then the signal TAMPER_DETECT should not be asserted. Tamper detect logic 116 checks to confirm that TAMPER_DETECT is not asserted. Tamper detect logic 116 periodically checks each of the conductors of each of the anti-tamper meshes in this way, checking with the current sources disabled and then with the current sources enabled, to confirm that there has been no tamper condition.

In the presently described example of FIG. 5, an application program is stored in FLASH memory 101. Encryption keys usable for communicating with a financial institution are stored in secure read only memory (ROM) within integrated circuit die 14. On power up, a secure boot loader mechanism within integrated circuit die 14 reads the application program from FLASH memory 101. The application program includes a header portion that includes an identification word. A processor 122 within integrated circuit die 14 checks the identification word in an attempt to validate the application program. If the application program is validated, then processor 122 executes the application program out of SDRAM. Integrated circuit die 31 is the SDRAM. During operation of POS terminal 100, the encryption keys that are stored in secure memory 123 in integrated circuit die 14 may be used by software and therefore may temporarily be present in SDRAM 31. Accordingly, upon detection of a tamper condition, integrated circuit die 14 causes SDRAM 31 to be erased and also erases temporary unsecured registers within die 14 that a thief may be able to read after accessing the dice 14 and 31. POS terminal 100 is of such a design that the encryption keys cannot be read out of die 14 following a tamper detect condition. See U.S. patent application Ser. No. 10/918,272 for future details.

Figure 9:
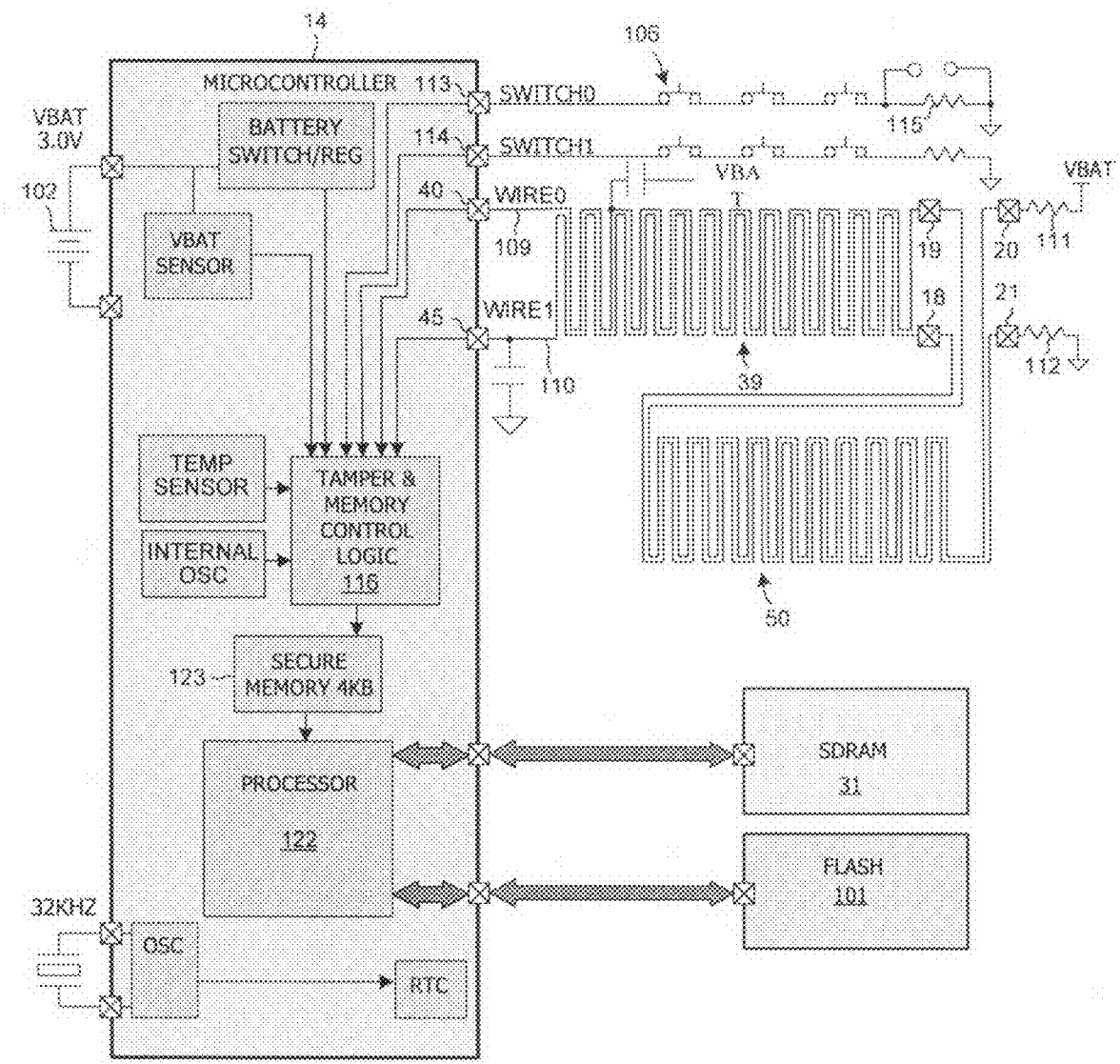
FIG. 9 is a simplified circuit diagram that shows another way that integrated circuit 14 can drive and monitor first and second anti-tamper security meshes 39 and 50.

FIG. 9 is a simplified circuit diagram that shows another way that the first and second meshes 39 and 50 can be connected to integrated circuit die 14. In this example, first mesh 39 extends laterally through the substrate member of the second BGA package portion 12 and second mesh 50 extends laterally through printed circuit board 104. Meshes 39 and 50 are, however, driven and monitored from only two terminals of integrated circuit 14. First conductor 109 (WIRE0) extends from terminal 40, through a bond wire, then up through the substrate member of the second BGA package portion, laterally through the substrate member, then back down through a bond ball of the second BGA package portion and to bond ball 19 of the first BGA package portion. From bond ball 19, the conductor continues down into the printed circuit board 104 upon which the secure module 10 is disposed. The conductor extends laterally through the mesh layer of the printed circuit board as a part of second mesh 50, and then extends back up to another bond ball 20 of the first BGA package portion. Band ball 20 is connected through the first BGA package portion to discrete resistor 111. The second conductor 110 (WIRE1) is connected in similar fashion. The second conductor 110 extends from integrated circuit terminal 45, through another bond wire, then up through the substrate member of the second BGA package portion, laterally through the substrate member, then back down through a bond ball of the second BGA package portion and to bond ball 18 of the first BGA package portion. From bond ball 18, the conductor continues down into the printed circuit board 104 upon which the secure module 10 is disposed. The conductor extends laterally through the mesh layer of the printed circuit board as a part of second mesh 50, and then extends back up to another bond ball 21 of the first BGA package portion. Band ball 21 is connected through the first BGA package portion to discrete resistor 112. The first mesh 39 and the second mesh 50 are therefore not driven and monitored separately from one another, but actually form a single larger anti-tamper mesh structure that extends both over and underneath the integrated circuits within the secure module 10. If the secure module 10 is to be used in a configuration without second mesh 50, then bond ball 19 can be coupled directly to bond ball 20 by a short trace on printed circuit board 104 or alternatively by a connection on secure module 10 itself. In the same way, bond ball 18 would be coupled directly to bond ball 21.

Figure 10:
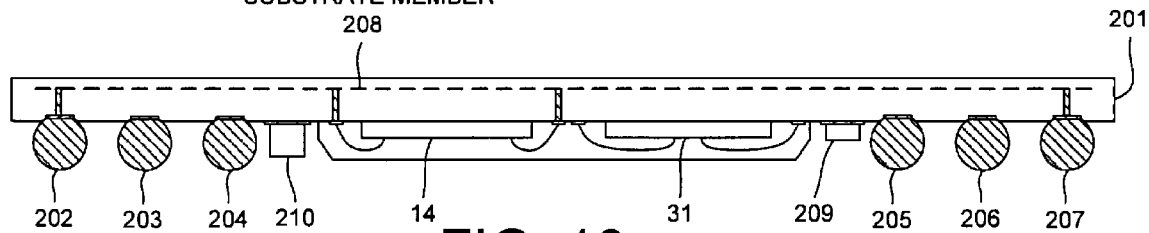
FIGS. 10-12 are diagrams of a single cavity-down ball grid array (BGA) package whose substrate member includes an anti-tamper security mesh in accordance with a second novel aspect.

FIG. 10 is a cross-sectional diagram of a secure module 200 in accordance with a second novel aspect. Secure module 200 is a cavity-down BGA package. The first and second integrated circuits 14 and 31 of the embodiment of FIGS. 1-6 are disposed side by side in this cavity. Secure module 200 includes integrated circuit dice 14 and 31, a substrate member 201, and an array of bond balls. Six bond balls 202-207 are illustrated in the cross-sectional diagram of FIG. 7. Substrate member 201 includes an anti-tamper security mesh 208 that is embedded in substrate member 201. In one example, anti-tamper security mesh 208 also extends through bond balls of the periphery of module 200 to form a picket fence security mesh structure. Integrated circuit die 14 drives mesh 208 and monitors mesh 208 for a tamper detect condition. Each of the two conductors of mesh 208 is terminated by a discrete resistor that is surface mounted to substrate member 201 in the cavity along with the integrated circuit dice 14 and 31. Discrete component 209 is one of these resistors. Discrete component 210 is a bypass capacitor. The circuit operation of FIG. 9 is the same as the circuit operation described above of the embodiment of FIGS. 1-8.

In addition, when secure module 200 is disposed in a POS terminal, integrated circuit die 14 is surface mounted to a printed circuit board as explained in connection with FIG. 12. Integrated circuit die 14 is coupled through inner bonds balls 204 and 205 and conductive vias 211 and 212 to second mesh 50 in the underlying printed circuit board. Integrated circuit die 14 drives and monitors anti-tamper mesh 50 as described in connection with the embodiment of FIGS. 1-8. There are two bond balls used to connect to each of the two conductors of second mesh 50, one for connecting a first end of the conductor to the tamper terminal of the integrated circuit, and a second for connecting the second end of the conductor to the discrete termination resistor.

Figure 11:
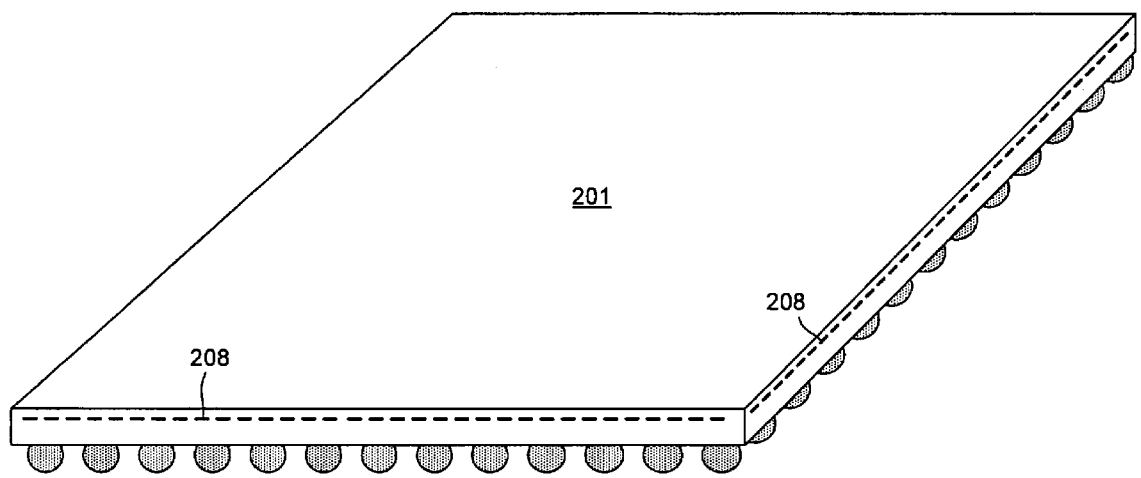

FIG. 11 is a perspective view of module 200 of FIG. 10. The dashed line illustrates the plane of the first mesh 208.

Figure 12:
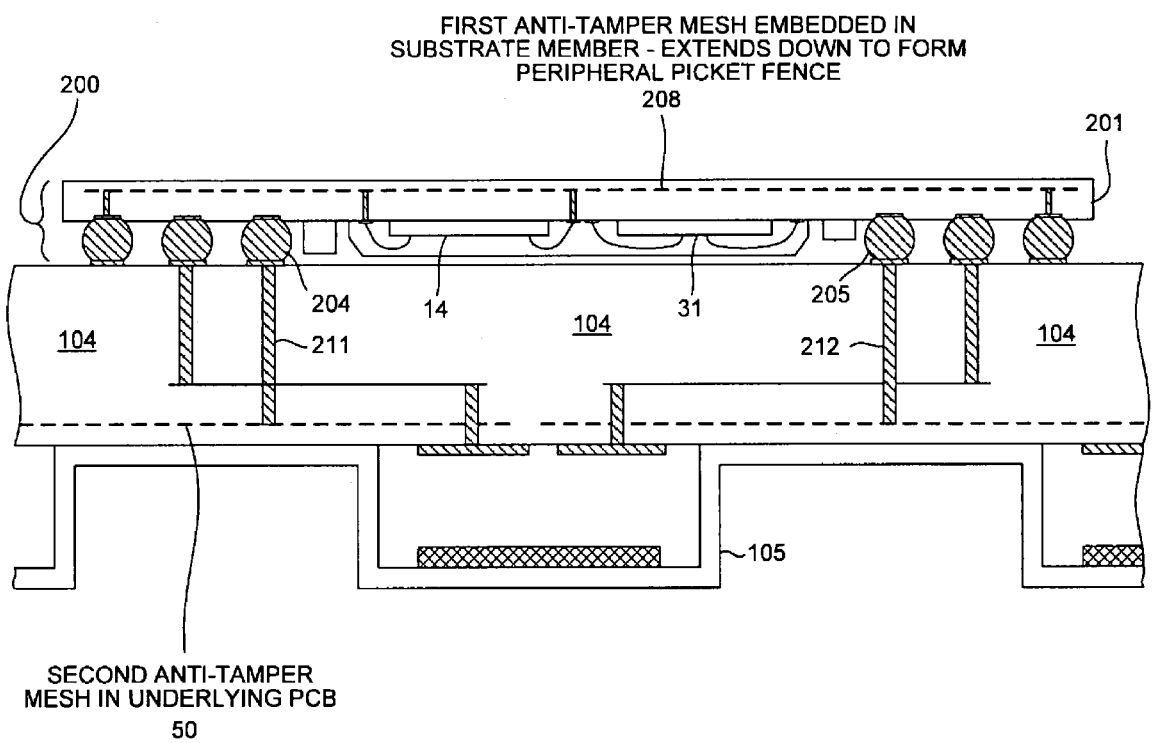

FIG. 12 is a simplified cross-sectional diagram that shows how integrated circuit-die 14 is coupled to the two conductors of the second mesh 50.

Figure 13:
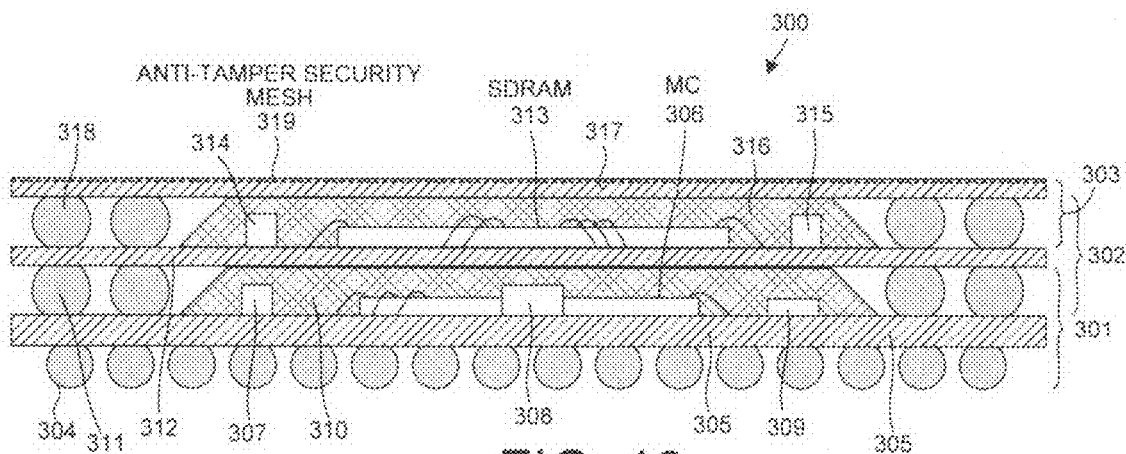
FIGS. 13, 14, 17, 18, 19, 20, 22, 23 and 25 are simplified cross-sectional diagrams of secure modules in accordance with nine corresponding novel aspects.

FIG. 13 is a simplified cross-sectional diagram of a package-on-package (POP) secure module 300 in accordance with another novel aspect. POP secure module 300 includes a first ball grid array (BGA) package portion 301, a second BGA package portion 302, and a BGA mesh cap 303. First BGA package portion 301 includes an array of first bond balls 304 that substantially cover a first bottom side of a first substrate member 305. First BGA package portion 301 also includes a first integrated circuit die 306 that is fixed to a second side of first substrate member 305. First substrate member 305 includes an array of first surface mount attachment lands (not shown) that are exposed on the second upper side of first substrate member 305. In one example, first integrated circuit die 306 is microcontroller 14 of FIG. 9. First integrated circuit 306 is fixed to, and wire bonded to, first substrate member 305 as illustrated. Also fixed to first substrate member 305 are discrete components 307-309. The taller discrete components 307 and 308 are bypass capacitors. The shorter discrete component 309 is one of two termination resistors for an anti-tamper security mesh. First integrated circuit die 306 and discrete components 307-309 are covered by an amount of epoxy resin encapsulant 310 as illustrated.

Second BGA package portion 302 includes an array of second bond balls 311, a second substrate member 312, a second integrated circuit die 313, discrete components 314-315, and an amount of encapsulant 316. The second bond balls 311 are disposed in two concentric rings around the periphery of second substrate member 312 to leave a central cavity-down volume that is devoid of bond balls. This central cavity-down volume accommodates the encapsulant 310 and integrated circuit die 306, and discrete components 307-309 as illustrated. The second bond balls 311 of the second BGA package portion 302 register with and are fixed to corresponding ones of the land on the upper side of first substrate member 305 of the first BGA package portion 301.

BGA mesh cap 303 includes a third substrate member 317 and an array of third bond balls 318. The third bond balls 318 are disposed in two concentric rings around the periphery of third substrate member 317 to leave a central cavity-down volume that is devoid of bond balls. This central cavity-down volume accommodates the encapsulant 316 and second integrated circuit die 313, and discrete components 314-315 as illustrated. Third substrate member 317 includes an anti-tamper security mesh 319 of conductors. A first of the conductors of the anti-tamper mesh is coupled to a first terminal (for example, terminal 40 of FIG. 7) of first integrated circuit die 306. A second of the conductors is coupled to a second terminal (for example, terminal 45 of FIG. 7) of first integrated circuit die 306. The first integrated circuit 306 drives and monitors the anti-tamper security mesh 319 in BGA mesh cap 303 in the way explained in connection with FIG. 7. Resistor 309 of FIG. 13 corresponds to resistor 111 of FIG. 7. Another surface mount discrete resistor (not shown) that is also surface mounted to first substrate member 305 corresponds to resistor 112 of FIG. 7. There is no exposed conductor on the upper exposed top side of third substrate member 317, nor is there any exposed conductor on any one of the four side edges of third substrate member 317.

Figure 14:
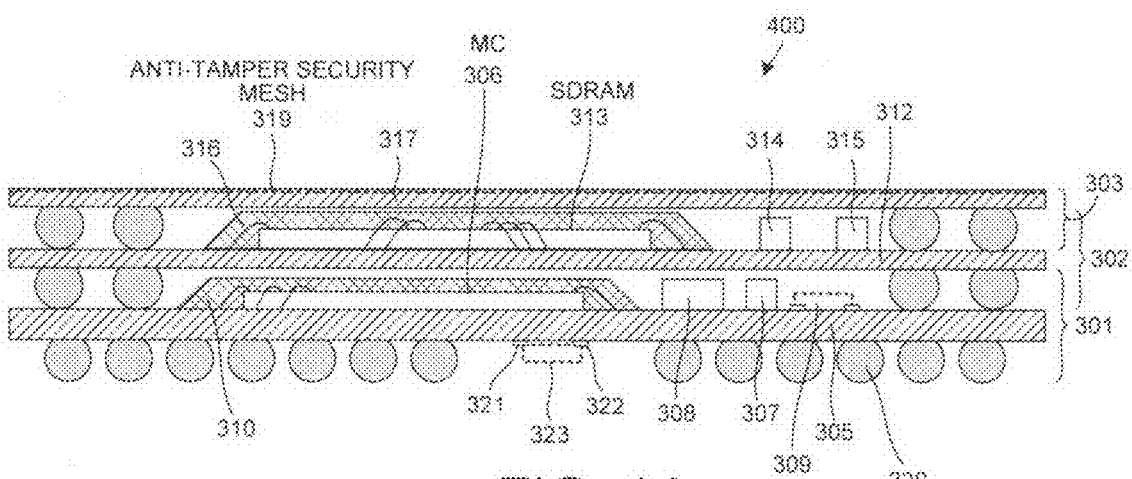

FIG. 14 is a cross-sectional diagram of a POP secure module 400 in accordance with another novel aspect. In POP secure module 400, encapsulant 310 covers the first integrated circuit die 306 as illustrated, but does not cover the top of discrete capacitor 308. Discrete capacitors 307 and 308 are the tallest discrete components. If encapsulant 310 were to cover discrete capacitors 307 and 308, then a repeatable thickness of encapsulant 310 may be required to cover the discrete capacitors for reliability reasons. This thickness of encapsulant may result in the distance between the top of first substrate member 305 and the bottom of second substrate member 312 being so large that the bond balls 311 of second BGA package portion 302 may have to be made larger than they otherwise would have to be. Providing the thicker encapsulant may result in a non-standard encapsulant thickness and therefore may increase manufacturing cost of the overall module due to specialized tooling. Providing larger bond balls may prevent the bond balls from being placed close to one another and therefore may result in the substrate 317 having to be made wider than it would otherwise have to be, thereby increasing the cost of the overall secure module. To solve these problems, encapsulant 310 does not cover discrete components 307-309. Similarly, encapsulant 316 is made to cover second integrated circuit die 313 but does not cover discrete components 314 and 315. Specialized tooling due to a non-standard encapsulant thickness is avoided, and the bond balls of the BGA mesh cap and second BGA package portion can be closely spaced.

Termination resistor 309 is connected and used as is resistor 111 of FIG. 9. Terminal 20 of FIG. 9 corresponds to bond ball 320 of FIG. 14. Bond ball 320 is electrically connected to a first terminal of resistor 309. A second terminal of resistor 309 is electrically connected within first BGA package portion 301 to a DC voltage node as illustrated in FIG. 9. In some applications, it may be desirable to use a different termination resistance other than the resistance of discrete resistor 309. Secure module 400 is, however, to be a standard product usable by multiple POS terminal manufacturers. In accordance with another novel aspect, there are no bond balls fixed to an area of the bottom of substrate member 305 so that a cavity-down volume is created. When secure module 400 is in use on a printed circuit board within a POS terminal, this volume is protected on the sides by bond balls of the first BGA package portion, and on the top by the substrate member of the first BGA package portion, and on the bottom by the printed circuit board upon which module 400 is surface mounted. There are two surface mount component attachment pads 321 and 322 to which a discrete surface mount resistor 323 can be mounted. Surface mount pad 321 is connected by conductors within the first BGA package portion 301 to one of the first bond balls of the first BGA package portion 301. Surface mount pad 322 is electrically connected within first BGA package portion 301 to a DC voltage node as illustrated in FIG. 9. A POS terminal manufacturer who receives module 400 in assembled form (with the first BGA package portion, the second BGA package portion, and the mesh cap all fixed together) can surface mount a resistor of the manufacturer's choice to the surface mount pads 321 and 322. The POS terminal manufacturer can use added resistor 323 to terminate the manufacturer's anti-tamper mesh rather than using resistor 309 by providing appropriate connections in the underlying printed circuit board to which the module 400 is attached.

Figure 15:
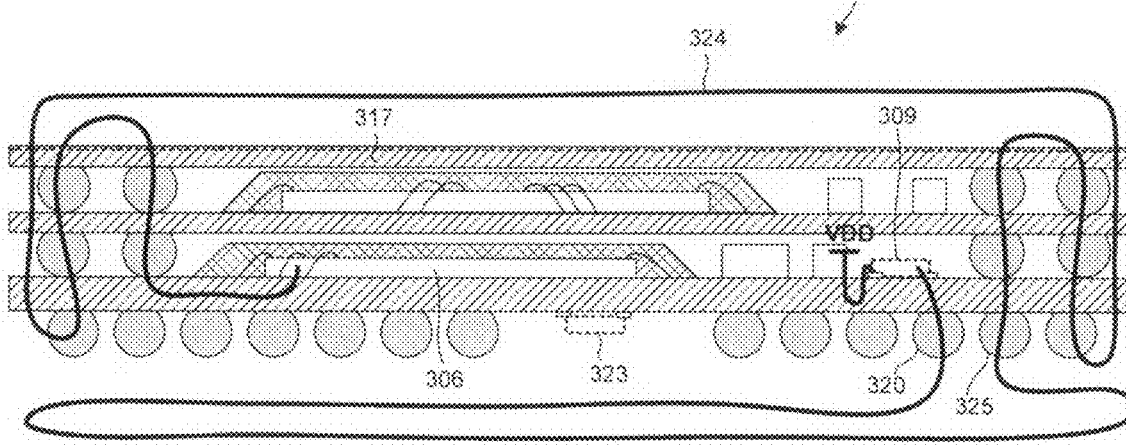
FIGS. 15, 16 and 16A illustrate how the secure module of FIG. 14 can be connected to use a termination resistor with the secure module or to use a termination resistor that is added to the bottom side of the secure module or to use a termination resistor that is disposed on the POS PCB underneath the secure module.

FIG. 15 illustrates the use of resistor 309 to terminate a conductor of the anti-tamper security mesh. A terminal of integrated circuit 306 is coupled to the first terminal of resistor 309 by a conductive path. The conductive path is illustrated by heavy line 324. The conductive path extends from integrated circuit 306 up to the mesh 319 in mesh cap 303 through inner bond balls that are not at the periphery of the module 400. The conductive path extends down and up through pickets of a picket fence mesh structure (see prior description in association with FIG. 4), then from left to right across mesh cap 303, then extends down and up through other pickets, and then down through other inner bond balls that are not at the periphery of module 400, to bond ball 325. The portion of arrow 309 at the bottom of the diagram represents an interconnection made through a mesh structure in the printed circuit board to which module 400 is mounted. The interconnection couples bond ball 325 to bond ball 320 so the conductive path extends to the first terminal of resistor 309. The supply voltage VDD is present on the second terminal of resistor 309 as illustrated in FIG. 15.

Figure 16:
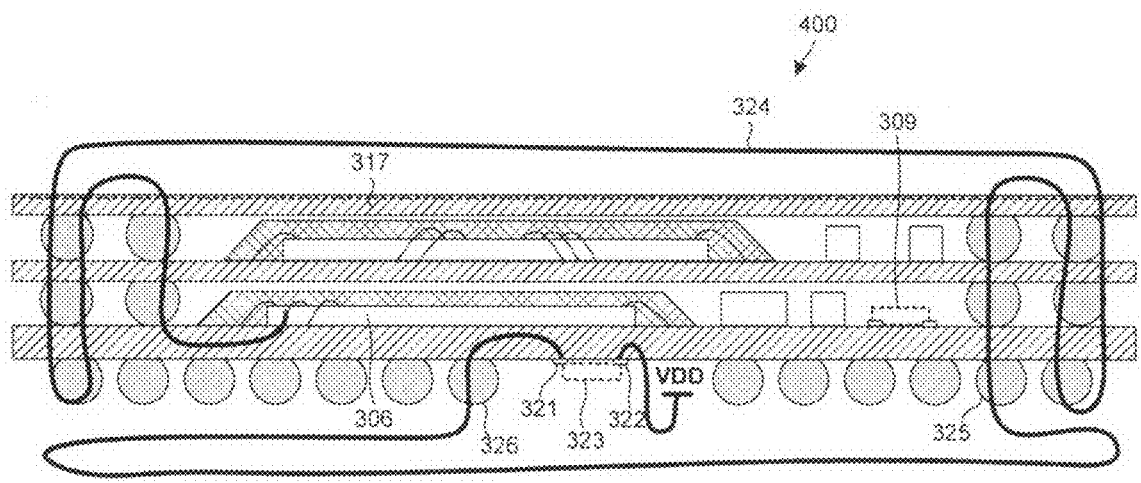

FIG. 16 illustrates the use of resistor 323 to terminate the anti-tamper security mesh. The portion of heavy line 324 at the bottom of the diagram represents an interconnection made through the mesh structure with the printed circuit board to which module 400 is mounted. The interconnection couples bond ball 325 to bond ball 326. Bond ball 326 is coupled by connections within first BGA package portion 301 to the first terminal of resistor 323. The supply voltage VDD is present on the second terminal of resistor 323 as illustrated in FIG. 16.

Figure 16A:
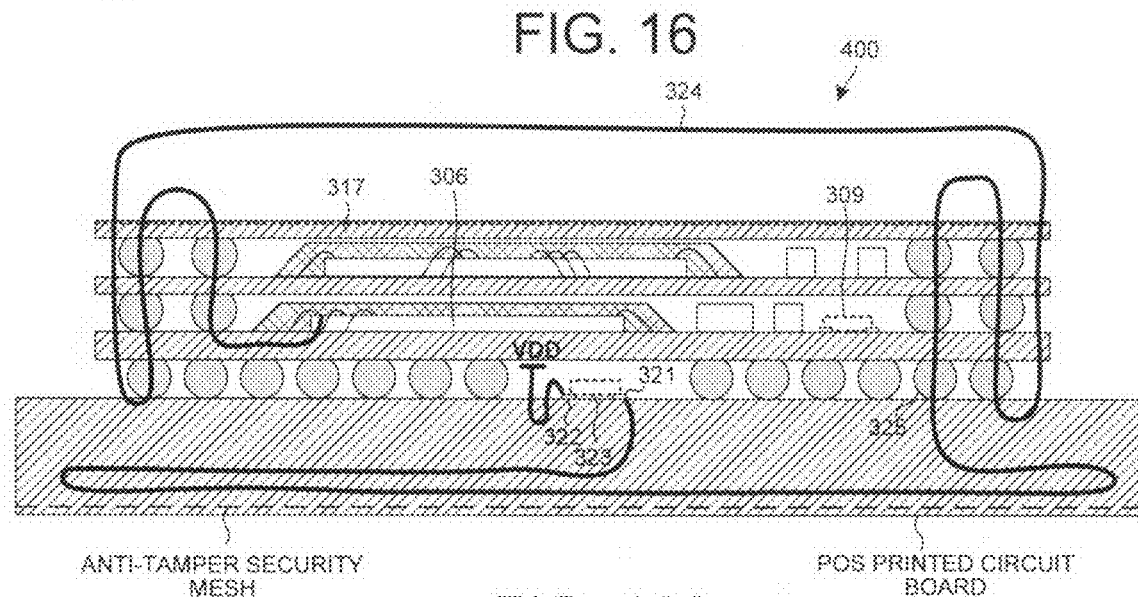

FIG. 16A illustrates the use of resistor 323 to terminate the anti-tamper security mesh where the termination resistor 323 is not fixed to the bottom side of secure module 400, but rather is surface-mounted to the upper side of the POS printed circuit board that underlies the second module 400. As illustrated, the conductor of the anti-tamper mesh represented by heavy line 324 extends to the first terminal of resistor 323, and the second terminal of resistor 323 is coupled to supply voltage VDD by a connection (not shown) of the POS printed circuit board.

In another novel aspect, BGA mesh cap 303 is marketed and sold as a separate component. The bond balls on BGA mesh cap 303 are such that BGA mesh cap 303 can be piggy-back mounted onto a BGA package that has appropriate lands. Alternatively, BGA mesh cap 303 can be surface mounted directly to a larger system printed circuit board so that the mesh cap covers another integrated circuit disposed on the printed circuit board. The bond balls of the two concentric rings of bond balls of BGA mesh cap 303 can be staggered to make probing through the two rings more difficult. In one example, substrate member 317 of BGA mesh cap 303 is an inexpensive epoxy resin fiberglass reinforced printed circuit board having four side edges. The surface of the bottom side is substantially planar and extends in a plane to all side faces of substrate member 317. Similarly, the upper surface of the substrate member is substantially planar and extends in a plane to all side faces. The conductors of the anti-tamper mesh are embedded within the substrate member 317 and/or are conductors located on the bottom surface of substrate member 317. There are no exposed conductors of the anti-tamper mesh on the upper side of BGA mesh cap 303 nor are there conductors of the anti-tamper mesh on the side faces of BGA mesh cap 303.

Figure 17:
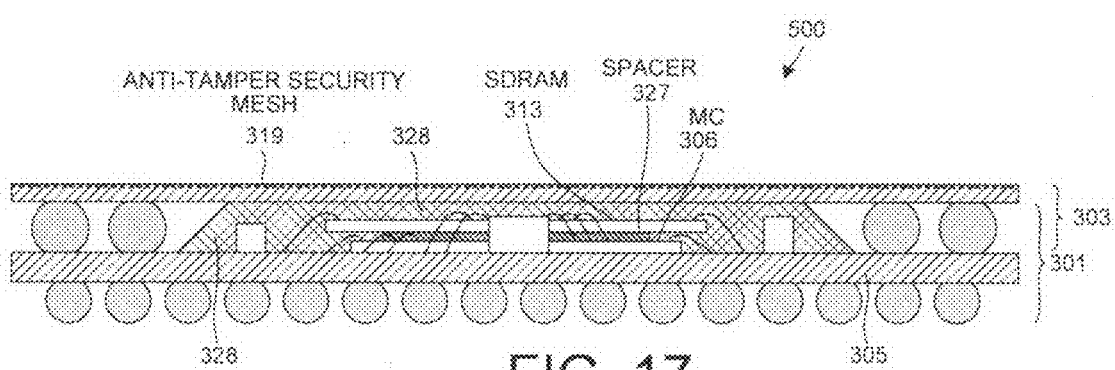

FIG. 17 is a cross-sectional diagram of a secure module 500 in accordance with another novel aspect wherein the first and second integrated circuit dice are wire bonded to the substrate member of the first BGA package portion using die stacking techniques. In module 500, the second BGA package portion of FIG. 13 is not provided, but rather BGA mesh cap 303 is piggy-back mounted directly to the lands on upper side of first BGA package portion 301. This is facilitated by the lands on the first and second BGA package portions being identical where the option exists for other versions of the secure module to include both a first and a second BGA package portion.

The first integrated circuit die 306 (the microcontroller integrated circuit of FIG. 9) is fixed and wire bonded to substrate member 305 of first BGA package portion 301. A spacer 327 is then placed onto the first integrated circuit die 327 as illustrated, and the second integrated circuit die 313 is placed on spacer 327. The second integrated circuit die 313 (an SDRAM integrated circuit) is then wire bonded to substrate member 305 of first BGA package portion 301. The stacked-die structure, as well as discrete components including mesh terminating resistors, are covered with an encapsulant 328. As explained in connection with FIG. 14, the encapsulant 328 may be made to cover the integrated circuit dice but is not made to cover the tallest discrete components if the tallest discrete components are taller than the stacked die structure. The anti-tamper mesh 319 in mesh cap 303 is controlled and monitored by tamper detect logic in integrated circuit die 306, and as described above, the conductors of the mesh are brought out to bond balls on the bottom of the secure module so that the anti-tamper mesh can be made to extend underneath (in the underlying printed circuit board) the secure module when the secure module is in place on the printed circuit board within a POS terminal.

Figure 18:
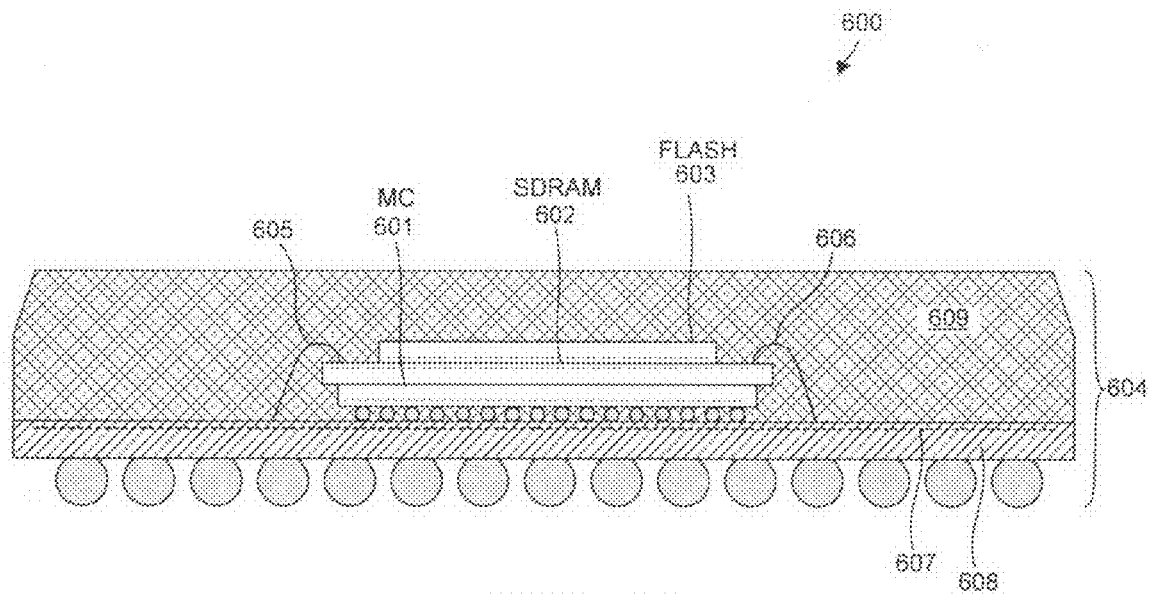

FIG. 18 is a simplified cross-sectional diagram of another secure module 600 in accordance with another novel aspect. Module 600 includes a first integrated circuit die 601 (a microcontroller that corresponds to die 14 of FIG. 1), a second integrated circuit die 602 (an SDRAM that corresponds to die 31 of FIG. 1), and a third integrated circuit die 603 (a FLASH memory that corresponds to integrated circuit die 101 of FIG. 5). As illustrated, dice 602 and 603 are die-bonded to one another in face-to-face relation. The fine horizontal dashed lines within the rectangles representing SDRAM 602 and FLASH 603 in FIG. 18 represent the active circuitry on the face sides of the dice. Integrated circuit die 601 is bumped, and is flip-chip mounted face-side down in conventional flip-chip fashion to substrate member 608 of a BGA package portion 604. The circle symbols between die 601 and substrate member 608 represent flip-chip bumps (the circles are not to scale). Die 602 is wire bonded to the substrate member 608 as illustrated. The FLASH die 603 and SDRAM die 602 are specially designed to facilitate the face-to-face die bonding. Upper layer metallization may be added to properly orient flip-chip microbumps and flip-chip microlands on the two dice so that when the two dice are brought together in face-to-face relation, the microbumps and microlands properly line up and contact each other. Microcontroller 601 can access FLASH 603 through bond wires 605 and 606 to die 602 and connections within die 602. FLASH 603 and SDRAM 602 may be organized as two memories disposed on the same bus. Microcontroller 601 is, for example, able to access both these memories across the bus. Bond wires 605 and 606 are two conductors of this bus. Alternatively, each of FLASH 603 and SDRAM 602 is provided with its own separate bus as illustrated in FIG. 9. Microcontroller 601 includes tamper detect logic that controls and monitors an anti-tamper security mesh 607 within substrate member 608. The entire stacked-die structure, as well as other discrete components (not shown) that are surface mounted to substrate member 608, are covered with an encapsulant 609 to form a single BGA surface mount secure module 600.

Figure 19:
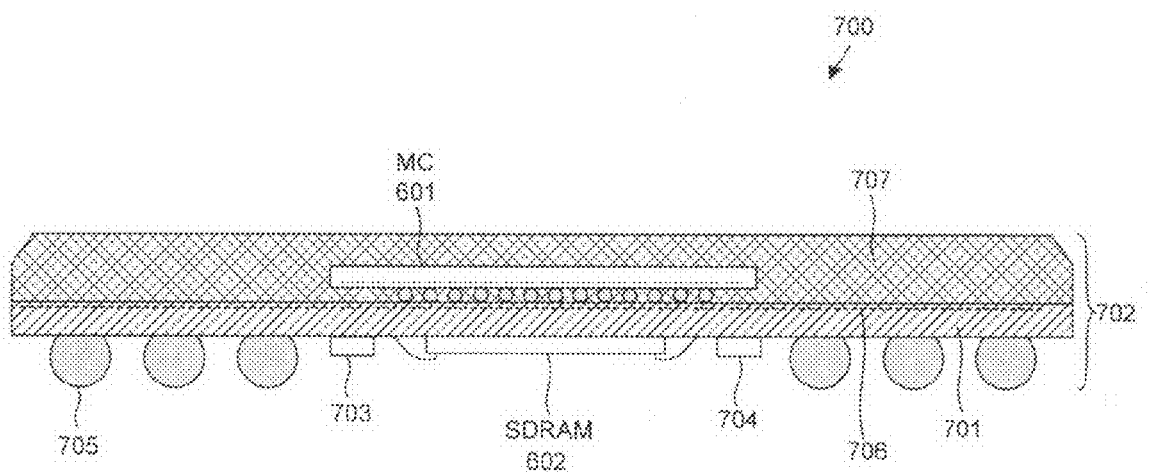

FIG. 19 is a simplified cross-sectional diagram of another secure module 700 in accordance with another novel aspect. In module 700, the microcontroller integrated circuit die 601 is flip-chip mounted to a substrate member 701 of a BGA package portion 702. The edges of die 601 are made to overhang the outermost flip-chip bumps by an unusually large distance to make probing from the side more difficult. Unlike the example of FIG. 18, bond balls are not distributed across the entire bottom surface of substrate member 701, but rather a central cavity-down volume underneath substrate member 701 includes no bond balls. SDRAM die 602 and a crystal 703 and a bypass capacitor 704 are fixed to the bottom surface of substrate member 701 in this cavity. SDRAM die 602 is wirebonded to substrate member 701 as illustrated. Die 602 is optionally thinned prior to attachment to substrate member 701 so that the bond balls 705 need not be of unusually large and nonstandard diameters. The FLASH integrated circuit 603 of FIG. 18 is provided in the example of FIG. 19 as a discrete packaged component that is mounted to the printed circuit board upon which module 700 is mounted. Substrate member 701 includes an anti-tamper security mesh 706 that is controlled and monitored as set forth in connection with the above-described other embodiments. Integrated circuit die 601 is covered with an encapsulant 707 to form a single BGA secure module structure.

Figure 20:
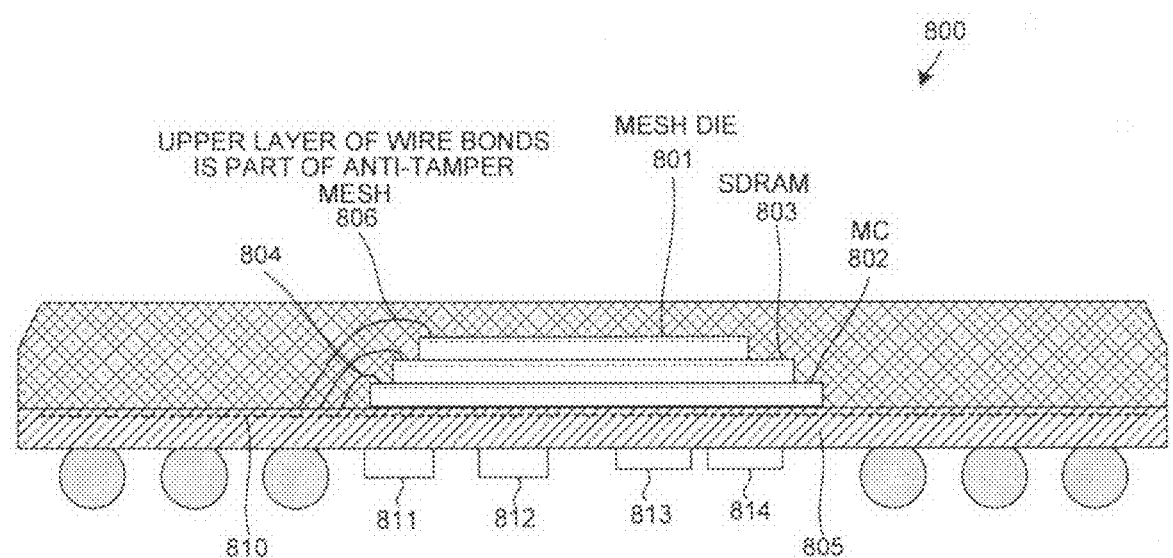
Figure 21:
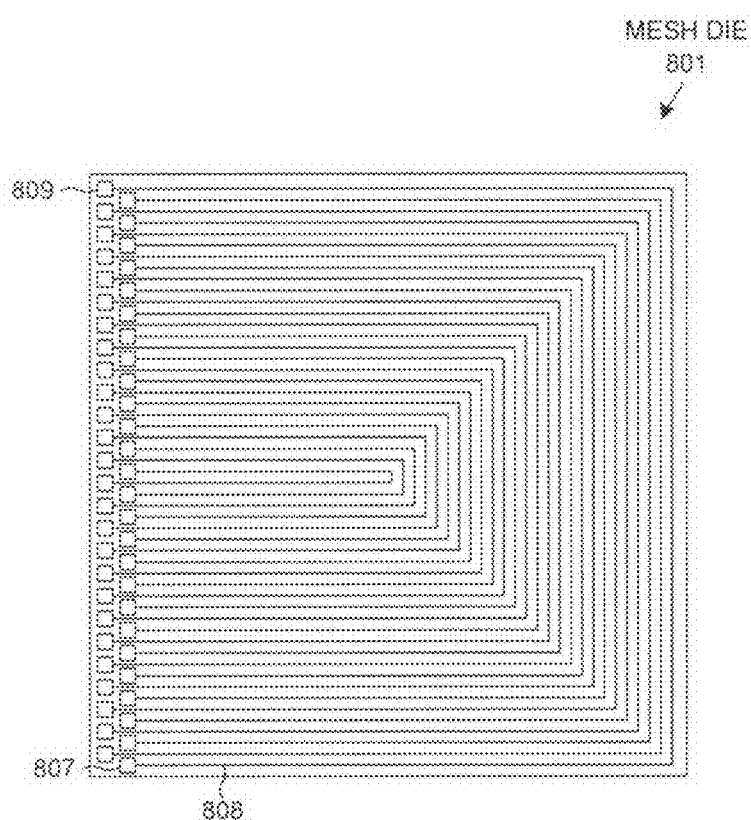
FIG. 21 is a simplified top-down diagram of a silicon mesh die used in the secure module of FIG. 20.

FIG. 20 is a simplified perspective view of a secure module 800 in accordance with another novel aspect. A mesh die 801 is die-stacked as illustrated along with the microcontroller integrated circuit die 802 and the SDRAM integrated circuit die 803. FIG. 21 is a more detailed top-down illustration of one example of mesh die 801. Mesh die 801 in this example is a processed silicon die but does not include any transistors or active components. Expensive silicon doping and silicon processing steps are not performed. Rather, die 801 includes metallization layers, insulation layers, and passivation layers only. Wire bond pads are disposed along the left edge of the die. A conductive path of an anti-tamper mesh structure extends from a terminal on integrated circuit 802, through a lower level wire bond 804 to substrate member 805, through substrate member 805 to an upper layer wire bond 806 and up to a bond pad 807 on mesh die 801, then through one of the conductors 808 on die 801 to another bond pad 809, then back down through another upper layer bond wire (not shown) to substrate member 805, and then back up through another upper layer bond wire to die 801, and around another conductor to another bond pad on die 801, and then back down through another upper layer bond wire to substrate member 805, and so forth. The upper layer of bond wires (bond wire 806 is one such bond wire) therefore forms part of the anti-tamper mesh structure along with the conductors on mesh die 801. Because mesh die 801 includes no active circuitry, it can be fabricated inexpensively using minimal semiconductor processing. The upper layer of bond wires protects lower layers of bond wires from probing and tampering.

Although the illustrated example of FIGS. 20 and 21 only involves anti-tamper bond wires disposed along one of the four sides of the stacked-die structure, the upper layer of anti-tamper bond wires can be made to extend around all four sides of the stacked-die structure. Each of the two conductive paths of the anti-tamper mesh that extends through die 801 also extends down and through corresponding conductors in an anti-tamper mesh layer 810 within substrate member 805 as explained above in connection with other illustrated embodiments. The electrical circuit diagram of the example of FIG. 20 is as illustrated in FIG. 9. Second anti-tamper security mesh 50 is disposed in the printed circuit board to which module 800 is surface mounted. Discrete components 811-814 including termination resistors for the mesh structure are surface mounted to the bottom side of substrate member 805. As in the example of FIG. 19, the FLASH integrated circuit of the circuit of FIG. 9 is provided as a separate packaged integrated circuit that is surface mounted to the printed circuit board upon which module 800 is disposed. As explained in connection with FIG. 16A, the termination resistors and/or other discrete components 811-814 may not be fixed to the bottom side of secure module 800, but rather may be mounted underneath the secure module 800 to the upper surface of the POS PCB to which the secure module is attached.

Figure 22:
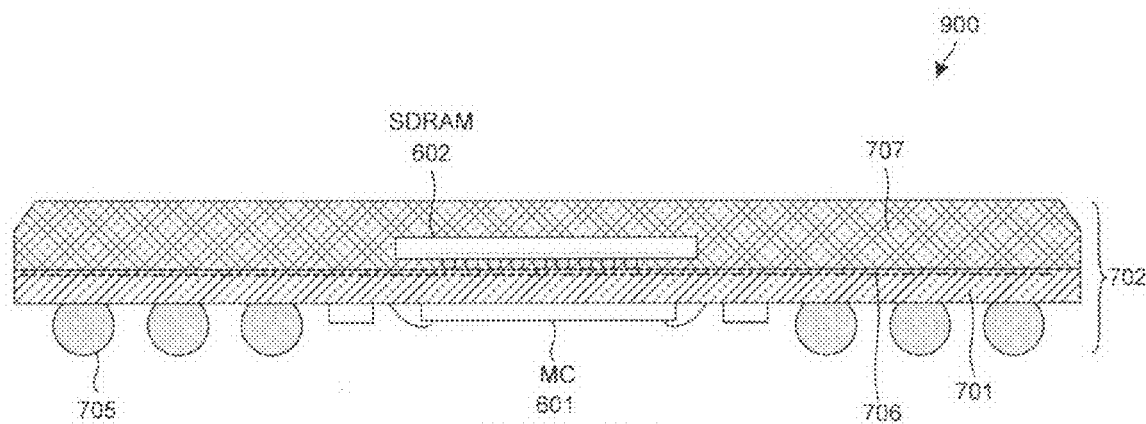

FIG. 22 is a simplified cross-sectional diagram of a secure module 900 in accordance with another novel aspect. Module 900 has a structure similar to the module of FIG. 19, except that the placement of the SDRAM integrated circuit die and the microcontroller integrated circuit die are reversed. Mesh termination resistors are surface mounted on the bottom side of substrate member 701.

Figure 23:
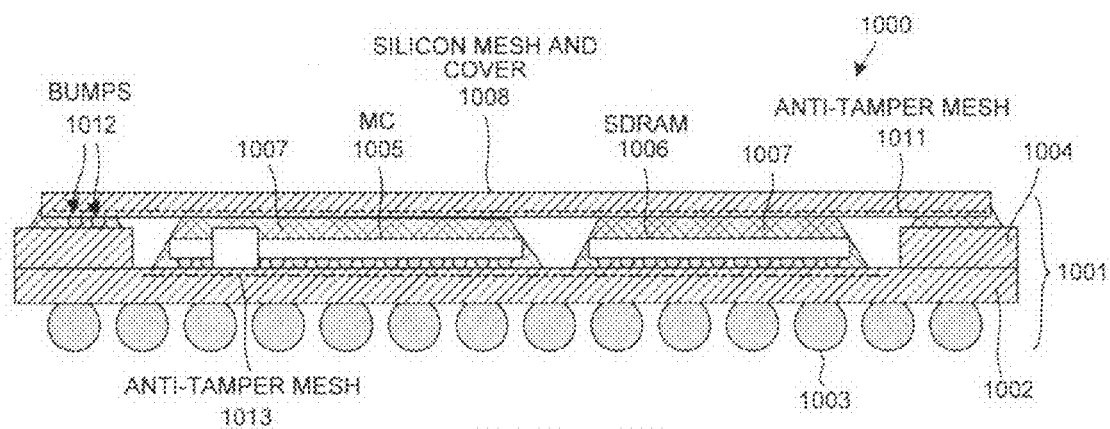

FIG. 23 is a simplified cross-sectional diagram of a secure module 1000 in accordance with another novel aspect. A BGA package portion 1001 includes a substrate member 1002 and a plurality of bond balls 1003. The bond balls 1003 are disposed on the bottom side of substrate member 1002. The substrate member 1002 is a laminated structure that includes a sidewall portion 1004 so that a relatively deep upward-facing cavity is formed for housing integrated circuit dice 1005 and 1006 and discrete components. The integrated circuit dice 1005 and 1006 are flip-chip mounted face-down within the cavity, and are covered with an encapsulant 1007.

Figure 25:
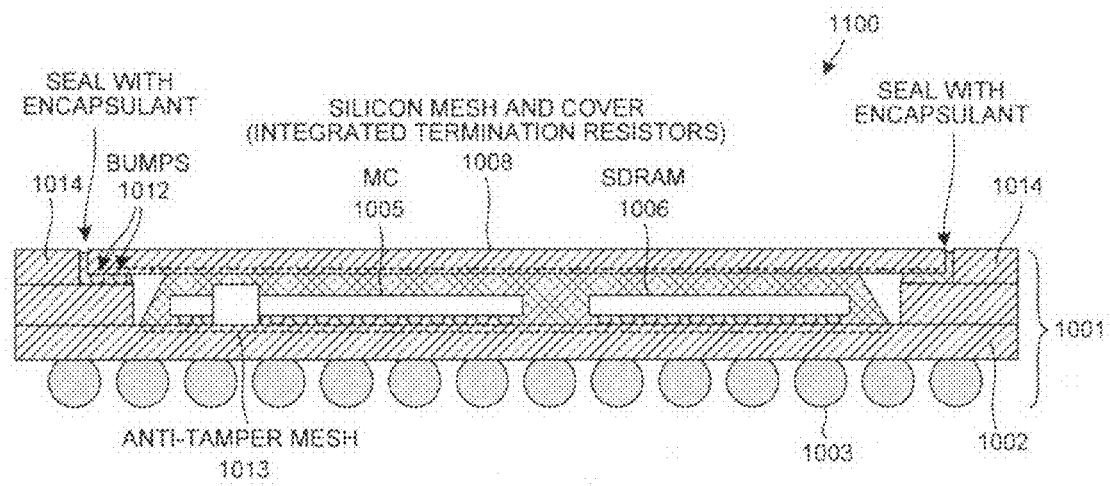
Figure 24:
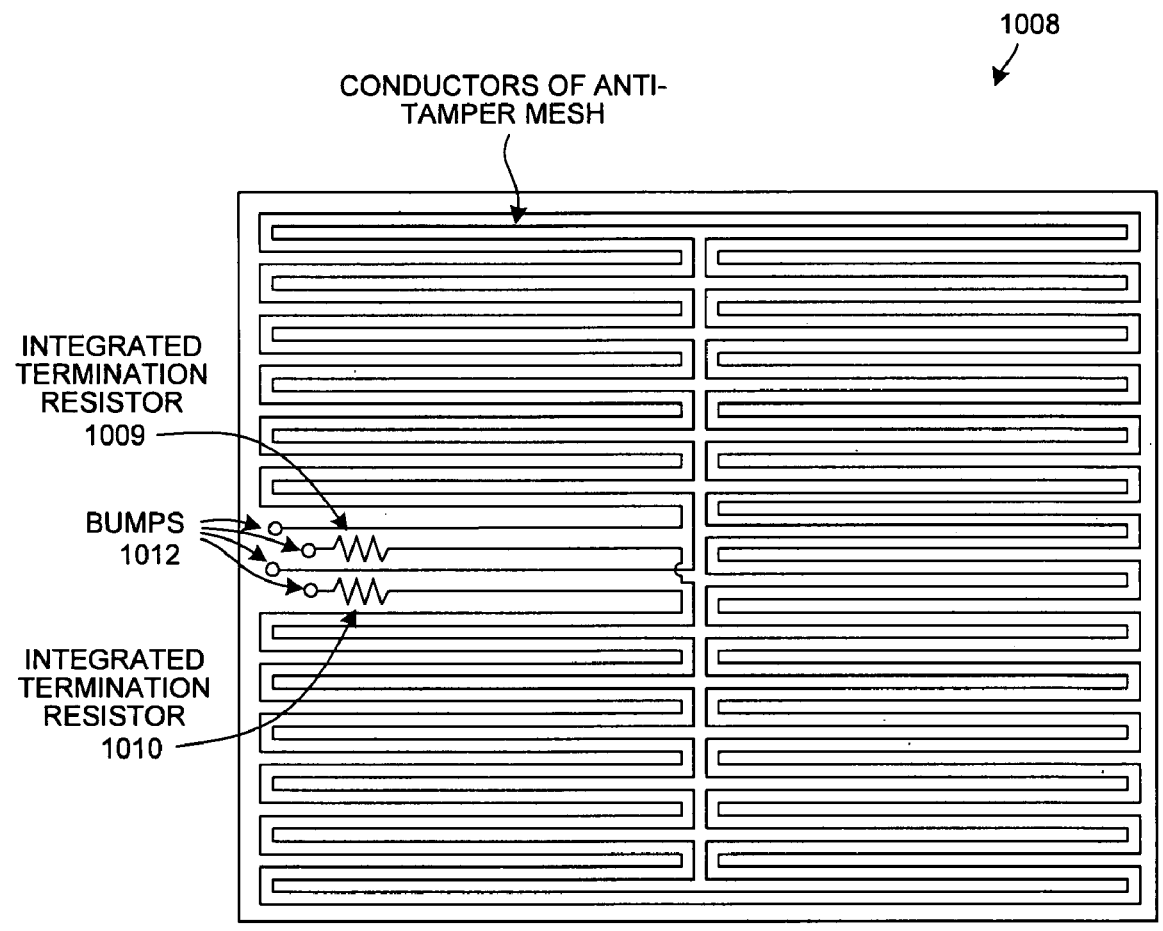
FIG. 24 is a simplified top-down diagram of a silicon cover structure used in the secure modules of FIGS. 23 and 25.

FIG. 24 is a diagram of a silicon mesh and cover structure 1008. Silicon mesh and cover structure 1008 is similar to the mesh die 801 of FIG. 21, except that cover structure 1008 is larger and cover structure 1008 does not use wire bonds as part of an anti-tamper mesh. In the example of FIG. 25, cover structure 1008 is a semiconductor die that includes integrated termination resistors 1009 and 1010. The resistors 1009 and 1010 may be realized as strips of resistive polysilicon. Cover structure 1008 includes a pair of conductors of an anti-tamper mesh that extend back and forth (for example, in a serpentine fashion) to cover the major surface of cover structure 1008. Cover structure 1008 may also include other integrated components including active circuitry and integrated capacitors. Cover structure 1008 is placed face-down over the cavity of FIG. 23 so that flip-chip bond bumps 1012 on cover structure 1008 contact corresponding flip-chip lands (not shown) on the upper surface of sidewall portion 1004 of the BGA package portion 1001. The dashed line 1011 in FIG. 23 represents the plane of the anti-tamper mesh of conductors on the surface of cover structure 1008. The conductors of anti-tamper mesh 1011 are coupled by flip-chip bond bumps 1012 on cover 1008 and by associated flip-chip lands and conductors (not shown) within BGA package portion 1001 to anti-tamper mesh 1013 in substrate member 1002 and to tamper detect logic within microcontroller integrated circuit die 1005. As in the other embodiments of FIGS. 13, 14, 17, 18, 19, 20 and 22, the conductors of the anti-tamper mesh (or meshes) in the secure module are couplable to conductors in an anti-tamper mesh embedded within an underlying printed circuit board to which the module is attached so that the anti-tamper mesh (or meshes) of the module and the anti-tamper mesh in the underlying printed circuit board together form a single anti-tamper mesh structure that is controlled and monitored by the microcontroller integrated circuit housing in the secure module.

FIG. 25 is a simplified cross-sectional diagram of a secure module 1100 in accordance with another novel aspect. Secure module 1100 is similar to secure module 1000, except that the ledge of substrate member 1002 that accommodates the cover structure 1008 has an added sidewall portion 1014. Sidewall portion 1014 covers the side of cover structure 1008 when cover structure 1008 is in place and therefore helps protect against probing and intrusion from the side. After the cover structure 1008 is flip-chip mounted to the substrate member 1002, an amount of encapsulant or other suitable filler is placed to seal the cover structure to substrate member joint and boundary.

Although certain specific embodiments are described above for instructional purposes, the teachings of this patent document have general applicability and are not limited to the specific embodiments described above. The substrate members of the first and second BGA package portions can be multi-layer ceramic structures. The substrate members can be flexible circuit boards made using a polyimide or polyester or other flexible base material. There can be conductors on the upper surface of the BGA mesh cap. In one example, the substrate of the BGA mesh cap is a thin printed circuit board that has only one layer of conductors and this layer of conductors is on the bottom surface of the substrate so that it is not exposed to tampering from outside the secure module. Surface mount attachment structures other than bond balls can be used on the first and second BGA package portions. The first wire mesh or part of the first wire mesh can be made from strips of conductive encapsulant material within a layer of nonconductive encapsulant material. The conductive encapsulant may, for example, be an ordinarily nonconductive epoxy resin material that is made conductive due to a dispersed conductive metal powder. The integrated circuit having the tamper control logic that drives and monitors the first mesh 39 can be mounted into the second (upper) BGA package portion as opposed to the first (lower) BGA package portion. The discrete components including, for example, the termination resistors can be surface mounted to the second BGA package portion as opposed to, or in addition to, being attached to the first BGA package portion. An anti-tamper mesh can be made to extend through the substrate member of the first BGA package portion in addition to the first anti-tamper mesh 39 extending through the substrate member of the second BGA package portion. Either of the integrated circuits can be flip-chip mounted rather than being wire bonded to their respective substrate members. Either of the integrated circuits can be replaced with a pair of face-to-face die-bonded integrated circuits. Multiple integrated circuits can be disposed side by side in the cavities of the first and second BGA package portions. The single picket fence mesh structure can be expanded to involve a staggered picket fence structure involving more than one peripheral ring of bond balls. Accordingly, various modifications, adaptations, and combinations of various features of the described embodiments can be practiced without departing from the scope of the invention as set forth in the claims.

What is claimed is:

1. A package-on-package secure module comprising:
   a first ball grid array (BGA) package portion having a first substrate member, a first integrated circuit die and an array of first bond balls, wherein the first bond balls are disposed on a first side of the first substrate member, wherein the first integrated circuit die is fixed to a second side of the first substrate member opposite the first side, and wherein the first substrate member includes an array of first lands that is disposed on the second side of the first substrate member;
   a second BGA package portion having a second substrate member, a second integrated circuit die and an array of second bond balls, wherein the second bond balls are fixed to the first lands of the first substrate member of the first BGA package portion, wherein the second integrated circuit die is fixed to a second side of the second substrate member opposite the first side, and wherein the second substrate member includes an array of second lands that is disposed on the second side of the second substrate member; and
   a BGA mesh cap comprising an array of third bond balls and a third substrate member, wherein the third bond balls are fixed to the second substrate member, wherein the third substrate member is fixed to no integrated circuit die but wherein the substrate member includes an anti-tamper security mesh of conductors, wherein a conductor of the anti-tamper security mesh is electrically coupled to the first integrated circuit die of the first BGA package portion, wherein the third substrate member has a rectangular planar upper surface, a rectangular planar bottom surface, and four side edges, and wherein the rectangular planar bottom surface extends to the first side edge, to the second side edge, to the third side edge and to the fourth side edge.

2. The package-on-package secure module of claim 1, wherein the first BGA package portion further comprises:
   an amount of encapsulant that covers the first integrated circuit die; and
   a discrete capacitor that is fixed to the second side of the first substrate member, wherein substantially no encapsulant covers the discrete capacitor.

3. The package-on-package secure module of claim 2, wherein the first BGA package portion further comprises:
   a discrete resistor that is fixed to the second side of the first substrate member, wherein a first terminal of the discrete resistor is electrically coupled to a first of the first bond balls of the first BGA package portion, and wherein a second terminal of the discrete resistor is electrically coupled to a second of the first bond balls of the first BGA package portion.

4. The package-on-package secure module of claim 3, wherein the package-on-package secure module is surface mounted to a printed circuit board, wherein a resistor is disposed between the package-on-package secure module and an upper surface of the printed circuit board, and wherein the resistor is electrically coupled to the conductor of the anti-tamper security mesh.

5. The package-on-package secure module of claim 4, wherein the third substrate member includes only one layer of conductors.

6. The package-on-package secure module of claim 1, wherein the second BGA package portion further comprises:
an amount of encapsulant that covers the second integrated circuit die; and
a discrete capacitor that is fixed to the second side of the second substrate member, wherein substantially no encapsulant covers the discrete capacitor.

7. The package-on-package secure module of claim 1, wherein the first integrated circuit die includes tamper detect logic.

8. The package-on-package secure module of claim 1, wherein sets of bond balls form an anti-tamper picket fence structure that encircles the first and second integrated circuit dice, wherein each set includes one of the first bond balls and one of the second bond balls and one of the third bond balls, and wherein the bond balls of each set are electrically connected together to form a substantially vertical picket of the picket fence structure.

9. The package-on-package secure module of claim 1, wherein the BGA mesh cap is a printed circuit board having no more than two layers of conductors.

10. The package-on-package secure module of claim 1, wherein the second bond balls are arrayed to include an outer ring of second bond balls and an inner ring of second bond balls, and wherein the third bond balls are arrayed to include an outer ring of third bond balls and an inner ring of third bond balls, and wherein the conductor of the anti-tamper security mesh of the BGA mesh cap is electrically coupled to the first integrated circuit die through a bond ball in the inner ring of second bond balls and through a bond ball in the inner ring of third bond balls.

11. The package-on-package secure module of claim 1, wherein a conductive path extends laterally from the first integrated circuit die through the first substrate member, vertically up through a first bond ball of the second bond balls, up through the second substrate member, vertically up through a first bond ball of the third bond balls, laterally through the anti-tamper security mesh, vertically down through a second bond ball of the third bond balls, down through the second substrate member, vertically down through a second bond ball of the second bond balls, through the first substrate member to a discrete resistor, wherein the discrete resistor is surface mounted to the first substrate member.

12. The package-on-package secure module of claim 1, wherein the discrete resistor is a termination resistor for the anti-tamper security mesh.

13. A package-on-package secure module comprising:
a first package portion having a first substrate, a first integrated circuit die and an array of first bond balls, wherein the first bond balls are disposed on a first side of the first substrate, wherein the first integrated circuit die is fixed to a second side of the first substrate opposite the first side, and wherein the first substrate includes an array of first lands that is disposed on the second side of the first substrate;
a second package portion having a second substrate, a second integrated circuit die and an array of second bond balls, wherein the second bond balls are disposed on a bottom side of the second substrate and are fixed to the first lands of the first substrate member of the first package portion, wherein the second integrated circuit die is fixed to a top side of the second substrate opposite the bottom side, and wherein the second substrate member includes an array of second lands that is disposed on the top side of the second substrate; and
a mesh cap comprising a third substrate and an array of third bond balls, wherein the third bond balls are fixed to the second substrate, wherein the third substrate is fixed to no integrated circuit die but wherein the third substrate includes an anti-tamper security mesh of conductors, wherein a conductor of the anti-tamper security mesh is electrically coupled through at least one of the second bond balls to the first integrated circuit die of the first package portion, wherein the third substrate has a rectangular planar upper surface, a rectangular planar bottom surface, and four side edges, and wherein the rectangular planar bottom surface extends to the first side edge, to the second side edge, to the third side edge and to the fourth side edge.

14. The package-on-package secure module of claim 13, wherein the second substrate has a periphery, and wherein the second bond balls are disposed in concentric rings around the periphery of the second substrate leaving a central cavity-down volume that is devoid of second bond balls.

15. The package-on-package secure module of claim 14, wherein the central cavity-down volume accommodates the first integrated circuit die.

16. The package-on-package secure module of claim 13, wherein the first integrated circuit die includes tamper control logic, wherein the mesh cap comprises a first conductor and a second conductor, and wherein the tamper control logic is connected to the first conductor and to the second conductor.

17. The package-on-package secure module of claim 16, wherein the first conductor is not electrically coupled to the second conductor.

18. The package-on-package secure module of claim 16, wherein the tamper control logic is electrically coupled to the first conductor through at least one of the third bond balls.

19. The package-on-package secure module of claim 13, wherein the third substrate has a top side opposite the array of third bond balls, and wherein no exposed conductors are disposed on the top side of the third substrate.

20. The package-on-package secure module of claim 13, wherein the second package portion further comprises:
an amount of encapsulant that covers the second integrated circuit die; and
a discrete capacitor that is fixed to the top side of the second substrate, wherein substantially no encapsulant covers the discrete capacitor.

21. The package-on-package secure module of claim 13, wherein the package-on-package secure module is surface mounted to a printed circuit board, wherein a resistor is disposed between the package-on-package secure module and an upper surface of the printed circuit board, and wherein the resistor is electrically coupled to the conductor of the anti-tamper security mesh.

\* \* \* \* \*